(12) United States Patent
Kamikawa

(10) Patent No.: US 7,404,409 B2
(45) Date of Patent: Jul. 29, 2008

(54) SUBSTRATE PROCESSING SYSTEM AND SUBSTRATE PROCESSING METHOD

(75) Inventor: Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 565 days.

(21) Appl. No.: 10/901,405

(22) Filed: Jul. 29, 2004

(65) Prior Publication Data

US 2005/0051195 A1    Mar. 10, 2005

(30) Foreign Application Priority Data

Sep. 5, 2003    (JP)    ............... 2003-314578

(51) Int. Cl.
*B08B 3/00*    (2006.01)
(52) U.S. Cl. ...................................... 134/125
(58) Field of Classification Search .................. 134/125
See application file for complete search history.

(56) References Cited

U.S. PATENT DOCUMENTS

| | | | |
|---|---|---|---|
| 2001/0025605 A1* | 10/2001 | Nagakura | .................... 118/715 |
| 2002/0000240 A1 | 1/2002 | Kamikawa | |
| 2002/0037645 A1* | 3/2002 | Matsunaga et al. | .......... 438/680 |
| 2003/0091410 A1* | 5/2003 | Larson et al. | ................ 414/217 |

FOREIGN PATENT DOCUMENTS

JP    11-354604    12/1999

* cited by examiner

*Primary Examiner*—Michael Cleveland
*Assistant Examiner*—Samuel A Waldbaum
(74) *Attorney, Agent, or Firm*—Smith, Gambrell & Russell, LLP

(57) ABSTRACT

A substrate processing system includes a substrate transfer unit having a plural-wafer conveyer that transfers plural wafers collectively and a single wafer conveyer that transfers a single wafer at a time. The single-wafer conveyer is accessible to the plural-wafer conveyer to deliver and remove a wafer to and from the plural-wafer conveyer.

9 Claims, 11 Drawing Sheets

SUBSTRATE PROCESSING SYSTEM AND SUBSTRATE PROCESSING METHOD

BACKGROUND OF THE INVENTION

1. Field of the Invention

The present invention relates to a system and a method for processing (e.g., cleaning) substrates such as semiconductor wafers and LCD glass substrates.

2. Description of the Related Art

Semiconductor device manufacturing processes include a cleaning process by which semiconductor wafers are cleaned by supplying a chemical solution to the wafers. A batch-type processing system which processes a plurality of wafers collectively is generally used for performing the aforementioned cleaning process. A carrier containing a plurality of wafers, arranged parallel with each other and spaced at regular intervals, is delivered to the processing system. A wafer conveyer arranged in the processing system removes the wafers collectively from the carrier, and delivers them to the processing unit, where the wafers are subjected to a predetermined process by using a chemical solution. The wafer conveyer removes the processed wafers from the processing unit, and returns them into the carrier. Such a substrate processing system is disclosed in US2002/0000240A1, for example.

For the purpose of inspecting the processing condition, some of the product wafers removed from a carrier are replaced with monitor wafers (i.e., dummy wafers), and the product wafers and the monitor wafers are processed collectively. Upon inspecting the processed monitor wafers, interactions between the wafers during the process (e.g., re-adhesion of a polymer removed from one wafer to another wafer) can be found.

In the past, the replacement of the product wafers with the monitor wafers was carried out manually by the operator. In this case, careful handling of the wafers was necessary, and it was possible that particles adhered to the wafers.

JP11-354604A discloses a substrate processing system provided with a wafer conveyer. The wafer conveyer has a robot arm, to which a plural-wafer carrying hand or a single-wafer carrying hand is selectively attached. The processing system is provided with means for automatically changing the plural- and single-wafer carrying hands attached to the robot arm. In usual operation of the processing system, the plural-wafer carrying hand is attached to the robot arm. The plural-wafer carrying hand transfers product wafers collectively from a carrier to a posture changer, which changes the posture of the wafers before they are loaded into a processing unit and after they are unloaded from the processing unit. If it is necessary to rearrange the wafers held in the carrier or the posture changer, the single-wafer carrying hand attached to the robot arm handles the wafers one by one. JP11-354604A teaches that the single-wafer carrying hand is attached to the robot arm, and loads monitor wafers and product wafers to the posture changer. This prevents the adhesion of particles to the wafers which could occur due to manual handling by the operator. However, the wafer-carrying-hand changing operation requires a certain amount of time. Moreover, if the product and monitor wafers are loaded to the posture changer one by one, a considerably long time is necessary. These result in deterioration in throughput of the processing system.

JP11-354604A also discloses another substrate processing system provided with a plural-wafer conveyer and a single-wafer conveyer, both of which are capable of accessing a carrier and a posture changer in order to transfer wafers therebetween. The plural-wafer conveyer is arranged at the lower region of a wafer transfer area and the single-wafer conveyer is arranged at the upper region of the wafer transfer area. When one of the plural- and single-wafer conveyers accesses the posture changer, the other conveyer rises or descends to a suitable vertical position where the two conveyers do not interfere with each other. However, in order to achieve the aforementioned arrangement and operation of the two wafer conveyers, the transfer area must be large-sized, and each of the conveyers must have a large range of movement. In addition, if it is required that monitor wafers are loaded to a posture changer together with product wafers, the product wafers must be first loaded to the attitude changer by the plural-wafer conveyer, and then some of the product wafers must be replaced with the monitor wafers by the single-wafer conveyer one by one. This operation requires a considerably long time, resulting in deterioration in throughput of the processing system.

SUMMARY OF THE INVENTION

The present Invention has been made in view of the foregoing problems. It is therefore the object of the present invention to provide a substrate processing system, which is capable of automatically replacing a product wafer with a monitor wafer, without deterioration in throughput of the system and without increasing the size of a transfer area where the wafer conveyers are arranged. The present invention also provides a substrate processing system to achieve an object similar to the above.

In order to achieve the above objective, the present invention provides a substrate processing system, which includes: a plural-substrate conveyer adapted to hold a plurality of substrates collectively, and adapted to collectively deliver and remove a plurality of substrates to and from a substrate carrier, the plural-substrate conveyer including a plurality of substrate holding members each adapted to hold a substrate; and a single-substrate conveyer adapted to hold only one substrate at a time, adapted to deliver and remove a substrate to and from any one of a plurality of substrate holding slots of a substrate carrier, and adapted to deliver and remove a substrate to and from any one of the substrate holding members of the plural-substrate conveyer.

The present invention also provides a substrate processing system, which includes: a substrate processing unit having a substrate holding device and adapted to collectively process, by using a processing fluid, a plurality of substrates while they are collectively held by the substrate holding device; a plural-substrate conveyer adapted to hold a plurality of substrates collectively, adapted to collectively deliver and remove a plurality of substrates to and from a substrate carrier, and adapted to collectively deliver and remove a plurality of substrates to and from the substrate holding device of the substrate processing unit, the plural-substrate conveyer including a plurality of substrate holding members each adapted to hold a substrate; and a single-substrate conveyer adapted to hold only one substrate at a time, adapted to deliver and remove a substrate to and from any one of a plurality of substrate holding slots of a substrate carrier, and adapted to deliver and remove a substrate to and from any one of the substrate holding members of the plural-substrate conveyer.

The substrate processing system may further include a substrate storage adapted to hold at least one substrate, and the single-substrate conveyer may be adapted to deliver and remove a substrate to and from the substrate storage.

In one preferred embodiment, the substrate processing system further includes a plurality of carrier tables, arranged in a horizontal direction, each adapted to support a substrate carrier thereon. In this case, the substrate holding members of the plural-substrate conveyer are vertically spaced at predetermined intervals while each of substrate holding members is in a horizontal posture; the plural-substrate conveyer is provided with a horizontal moving mechanism adapted to move the substrate holding members in a direction parallel to the horizontal direction to allow the substrate holding members to access a substrate carrier supported by each of the carrier tables; and the single-substrate conveyer is adapted to access a substrate carrier supported by only one of the carrier tables.

In one preferred embodiment, the substrate processing system further Includes a plurality of carrier tables, arranged in a horizontal direction, each adapted to support a substrate carrier thereon; and a substrate storage adapted to hold at least one substrate. In this case, the substrate holding members of the plural-substrate conveyer are vertically spaced at predetermined intervals while each of the substrate holding members is in a horizontal posture; the plural-substrate conveyer is provided with a horizontal moving mechanism adapted to move the substrate holding members in a direction parallel to the horizontal direction to allow the substrate holding members to access a substrate carrier supported by each of the carrier tables; the single-substrate conveyer is adapted to deliver and remove a substrate to and from the substrate storage; and the single-substrate conveyer is adapted to access a substrate carrier supported by only one of the carrier tables.

In one preferred embodiment, the substrate processing is be configured so that: each of the substrate holding members is arranged in a horizontal posture; the substrate holding members are vertically spaced at predetermined intervals; and the plural-substrate conveyer includes a slide mechanism adapted to horizontally slide the substrate holding members as a unit, a rotation mechanism adapted to rotate the substrate holding members as a unit about a vertical rotation axis, and an elevation mechanism adapted to vertically move the substrate holding members as a unit.

The substrate processing system may further include a sequence controller. The controller is configured to control the plural-substrate conveyer and the single-substrate conveyer according to a predetermined sequence of operations including the steps of: (i) removing first sort of substrates collectively from a first substrate carrier by the plural-substrate conveyer; (ii) removing one of the first sort of substrates from one of the substrate holding members of the plural-substrate conveyer by the single-substrate conveyer; (iii) delivering said one of the first sort of substrates to the substrate storage by the single-substrate conveyer; (iv) removing a second sort of substrate from a second substrate carrier by the single-substrate conveyer; (v) delivering the second sort of substrate to said one of the substrate holding member by the single-substrate conveyer; (vi) repeating the steps (ii) to (v), if necessary; and (vii) delivering the substrates held by the plural-substrate conveyer collectively to the substrate holding device of the substrate processing unit by the plural-substrate conveyer.

According to another aspect of the present invention, a substrate processing method is provided, which includes the steps of: collectively removing a plurality of product substrates from a substrate carrier by a plural-substrate conveyer having a plurality of substrate holding members; removing one of the product substrates from one of the substrate holding members of the plural-substrate conveyer by a single-substrate conveyer adapted to transfer only one substrate at a time; removing a monitor substrate from a substrate carrier by the single-substrate conveyer; transferring the monitor substrate from the single-substrate conveyer to said one of the substrate holding members of the plural-substrate conveyer; collectively delivering the monitor substrate and the product substrates other than said one of the product substrate into a substrate processing unit by the plural-substrate conveyer; collectively processing the monitor substrate and the product substrates other than said one of the product substrates by the substrate processing unit; collectively removing the monitor substrate and the product substrates other than said one of the product substrates from the processing unit by the plural-substrate conveyer; removing the monitor substrate from the plural-substrate conveyer by the single-substrate conveyer; delivering the monitor substrate to a substrate carrier by the single-substrate conveyer; and collectively delivering the product substrates held by the plural-substrate conveyer to a substrate carrier by the plural-substrate conveyer.

The present invention also provides a substrate processing method including the steps of: collectively removing a plurality of product substrates from a substrate carrier by a first group of substrate holding members of a plural-substrate conveyer; removing one of the product substrates from one of the substrate holding members of the first plural-substrate conveyer, and delivering it to a substrate storage, by a single-substrate conveyer adapted to transfer only one substrate at a time; removing a monitor substrate from a substrate carrier, and delivering it to said one of the first group of substrate holding members of the plural-substrate conveyer, by the single-substrate conveyer; collectively delivering the monitor substrate and the product substrates other than said one of the product substrates into a substrate processing unit by the first plural-substrate conveyer; collectively processing the monitor substrate and the product substrates other than said one of the product substrates in the processing unit; collectively removing the monitor substrate and the product substrates other than said one of the product substrates from the substrate processing unit by a second group of substrate holding members of the plural-substrate conveyer; removing the monitor substrate from one of the second group of substrate holding members of the plural-substrate conveyer, and delivering it to a substrate carrier, by the single-substrate conveyer; removing said one of the product substrates from the substrate storage, and delivering it to one of the first group of substrate holding members of the plural-substrate conveyer; delivering said one of the product substrates to the substrate processing unit by said one of the first group of substrate holding members of the plural-substrate conveyer; processing said one of the product substrates by the substrate processing unit; removing said one of the product substrates by one of the first group of substrate holding members of the plural-substrate conveyer; removing said one of the product substrates from said one of the first group of substrate holding members of the plural-substrate conveyer, and delivering it to said one of the second group of substrate holding members of the plural-substrate conveyer, by the single-substrate conveyer; and collectively delivering the product substrates, which are held by the second group of substrate holding members of the plural-substrate conveyer, to a substrate carrier.

The present invention also provides a substrate processing system including the steps of: removing a substrate from a substrate carrier by a single-substrate conveyer adapted to transfer only one substrate at a time; transferring the substrate from a single-substrate conveyer to one of substrate holding members of a plural-substrate conveyer; delivering the substrate to a substrate processing unit by the plural-substrate conveyer; processing the substrate by the substrate processing unit; removing the substrate from the substrate processing unit by the plural-substrate conveyer;

removing the substrate from the plural-substrate conveyer unit by the single-substrate conveyer; and delivering the substrate to a substrate carrier by the single-substrate conveyer.

DESCRIPTION OF THE PERFERRED EMBODIMENTS

A preferred embodiment of a substrate processing system according to the present invention will be described for an example in which the processing system is adapted to carry out a cleaning process for removing a polymer adhered to substrates such as wafers.

Figure 1:
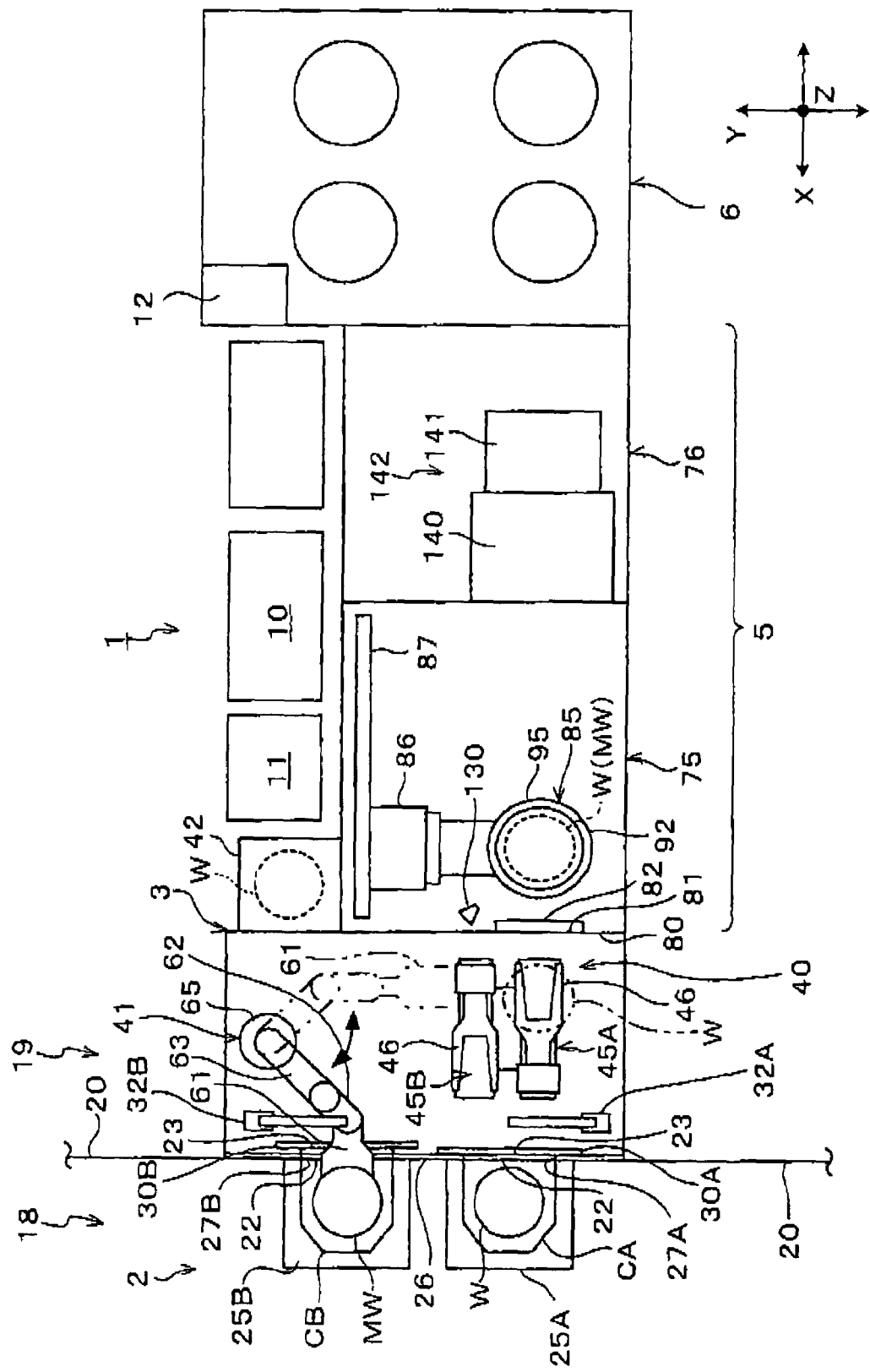
FIG. 1 is a top plan view schematically showing the entire structure of a substrate processing system according to the present invention.

As shown in FIG. 1, a substrate processing system 1 includes a carrier receiving-and-delivering section 2, a wafer transfer unit 3, a processing unit 5, and a processing liquid storage unit 6. The carrier receiving-and-delivering section 2 is adapted to receive carriers CA and CB (i.e., wafer containers) from an external carrier conveyer (not shown), and adapted to deliver the carriers CA and CB to the external carrier conveyer. The carrier CA contains a plurality of wafers W (i.e., product wafers) each having a substantially disc shape. The carrier CB contains a plurality of monitor wafers. MW (i.e., wafers for inspection) each having a substantially disc shape. The wafer transfer unit 3 is adapted to take out the wafers W and the monitor wafers MW from the carriers CA and CB placed at the carrier receiving-and-delivering section 2, and is adapted to convey the wafers W and the monitor wafers MW to the processing unit 5. The processing unit 5 is adapted to perform a cleaning process to the wafers W and the monitor wafers MW. The processing liquid storage unit 6 is adapted to store and/or generate processing liquids to be used in the processing unit 5. The wafer transfer unit 3 is arranged between the carrier receiving-and-delivering section 2 and the processing unit 5.

Figure 2:
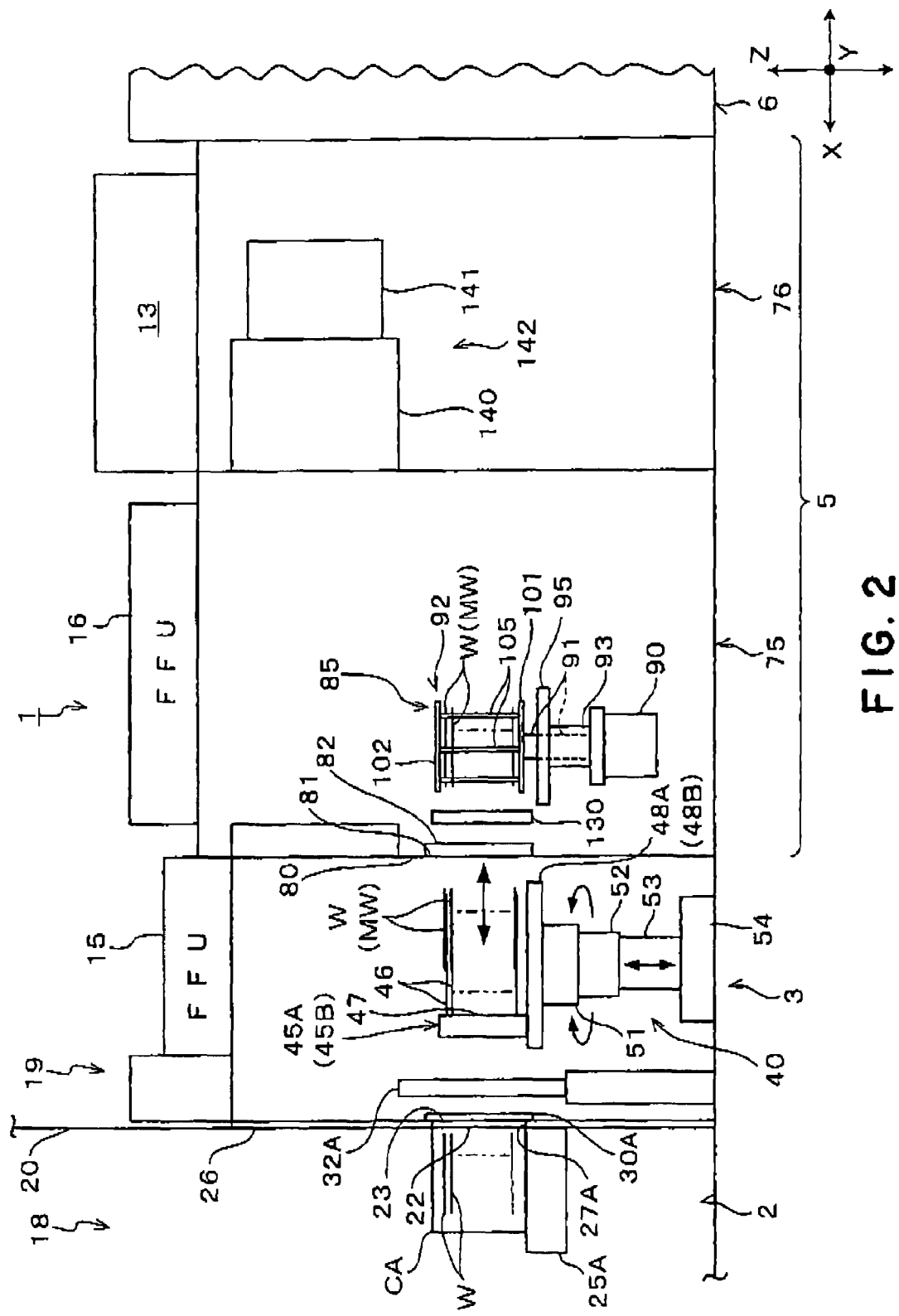
FIG. 2 is a side view schematically showing the partial structure of the substrate processing system shown in FIG. 1.

The processing system 1 further includes: a power source box 10 for supplying electric power to various electric driving mechanisms and electric control units arranged in the processing system 1; a wafer transfer unit control box 11 which contains therein control units for controlling the operations of various mechanisms of the wafer transfer unit 3; and a processing liquid storage unit control box 12 which controls the supply of the processing liquids in the processing liquid storage unit 6 to the processing unit 5. As shown in FIG. 2, a processing unit control box 13, which contains control units for controlling the operations of various mechanisms of the processing unit 5, is arranged on the top of the processing unit 5. A fan filter unit (FFU) 15, from which clean air flows downward into the wafer transfer unit 3, is arranged on the top of the wafer transfer unit 3. A fan filter unit (FFU) 16, from which clean air flows downward into the processing unit 5, is arranged on the top of the processing unit 5.

In the processing system 1, the carrier receiving-and-delivering section 2 is arranged in a clean area 18 of a factory, while the wafer transfer unit 3, the processing unit 5, the processing liquid storage unit 6, the power source box 10, the wafer conveying unit controlling box 11, the processing liquid storage unit controlling box 12 and the FFUs 15 and 16 are arranged in a maintenance area 19 of the factory. The clean area 18 and the maintenance area 19 are separated from each other by a partition wall 20 in order to prevent an atmosphere in the maintenance area 19 from penetrating into the clean area 18.

The wafer W and the monitor wafer MW are thin-disk shaped, and have the same dimension except for the surface structure. The carrier CA to be loaded to the carrier receiving-and-delivering section 2 contains the wafers W, each of which a polymer adheres to a surface (front surface) on which a semiconductor device is formed, and the carrier CB contains the monitor wafers MW, each of which a polymer or the like does not adhere thereto.

Figure 3:
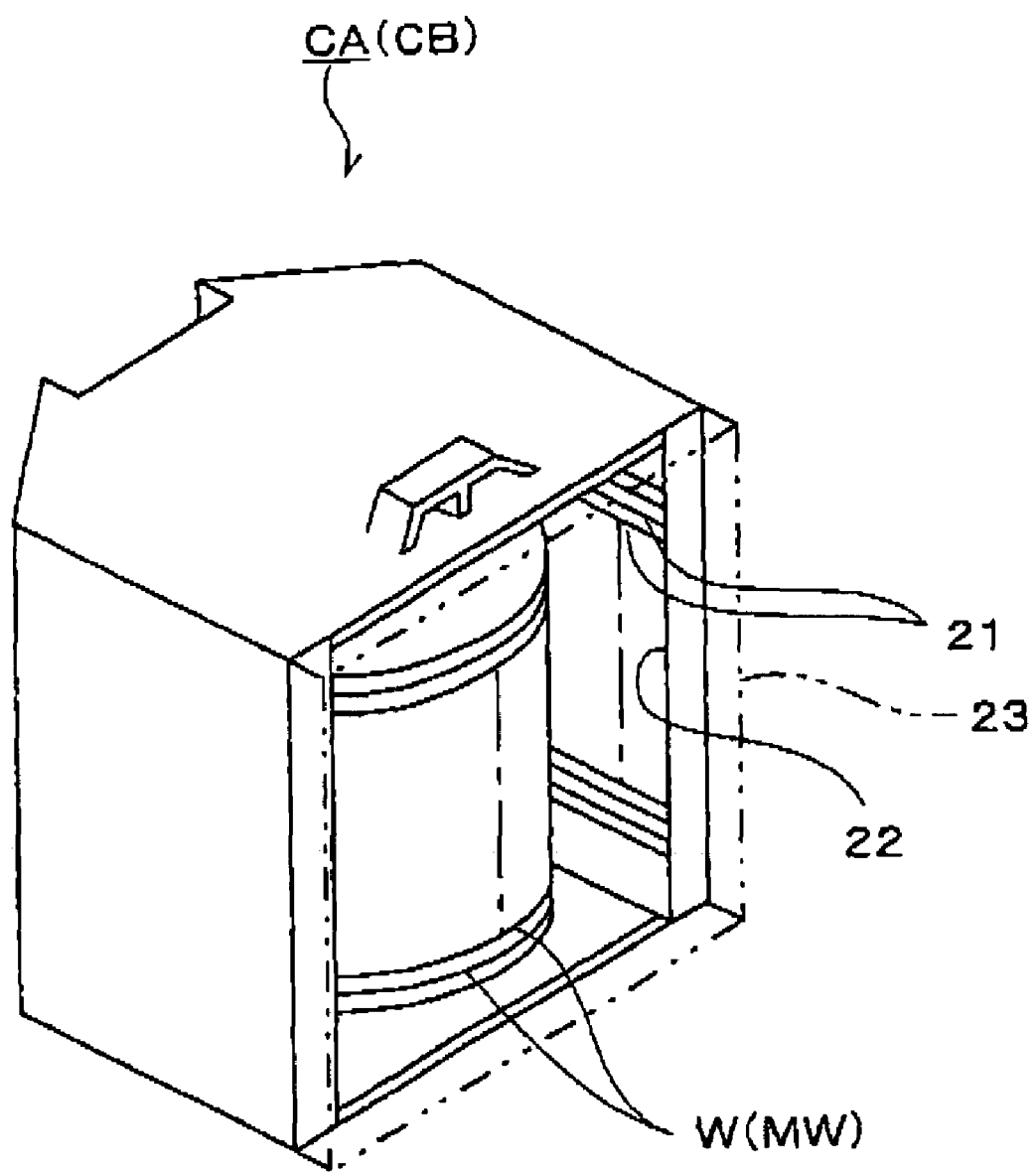
FIG. 3 is a perspective view of a carrier.

As shown in FIG. 3, plural (e.g., twenty-five) slots 21 for holding the wafers W are formed on inner walls of the carrier CA at predetermined intervals. Each slot 21 holds one wafer W while the front surface of the wafer W faces upward. Thus, plural (e.g., twenty-five) wafers W are contained in the carrier CA while the wafers W are substantially parallel with each other and spaced at predetermined intervals. An opening 22, through which the wafers W are loaded into or unloaded from the carrier CA, is formed on one side of the carrier CA. The carrier CA has a lid 23 for closing the opening 22. The carrier CB has the same structure as that of the carrier CA, and thus a detailed description thereof is omitted. Twenty-five monitor wafers MW are contained in the carrier CB while the monitor wafers MW are substantially parallel with each other and spaced at predetermined intervals.

As shown in FIG. 1, in the carrier receiving-and-delivering section 2, two carrier tables 25A and 25B are arranged so that they are aligned in a horizontal direction (Y-axis direction in FIG. 1). Windows 27A and 27B are formed in the partition wall 26 to correspond to the carrier tables 25A and 25B, respectively, The carriers CA and CB are respectively placed on the carrier tables 25A and 25B such that the portions of the carriers CA and CB around their openings 22 are respectively fitted in the windows 27A and 27B to close them.

Shutters 30A and 30B for closing the windows 27A and 27B, and shutter elevating mechanisms (not shown) for vertically moving the shutters 30A and 30B are arranged on an inner side (i.e., on a side of the wafer transfer unit 3) of the partition wall 26. When the lids 23 of the carriers CA and CB are respectively positioned in the windows 27A and 27B, the lids 23 are removed from the openings 22, and move vertically along the inner surface of the partition wall 26 together with the shutters 30A and 30B.

When the carriers CA and CB are not placed on the carrier tables 25A and 25B, the shutters 30A and 30B respectively close the windows 27A and 27B, so that particles or the like are prevented from entering into the wafer transfer unit 3 from outside. When the wafers W and the monitor wafers MW are loaded into and unloaded from the carriers CA and CB, the lids 23 of the carriers CA and CB are lowered and the windows 27A and 27B are opened.

The wafer transfer unit 3 has wafer counters 32A and 32B for counting the number of wafers W contained in the carrier CA and the monitor wafers MW contained in the carrier CB, respectively. Each of the wafer counters 32A and 32B comprises a reflex optical sensor having an infrared light emitter (not shown) and a light receiver (not shown). The wafer counters 32A and 32B respectively scan the wafers W and the monitor wafers MW in a vertical direction (Z-axis direction in FIG. 1) in order to inspect the number of wafers W and the monitor wafers MW, and conditions thereof (e.g, the condition in which the wafers are contained in the container), that is, whether or not the wafers W and the monitor wafers MW are contained at predetermined intervals.

Downflow air from the FFU 15 arranged on the top of the wafer transfer unit 3 is discharged from an exhaust port (not shown) arranged on a lower part of the wafer transfer unit 3. Accordingly, even if the windows 27A and 27B are opened, a part of the downflow air from the FFU 15 is prevented from entering the carriers CA and CB, thus preventing particles or the like from adhering to the inside of the carriers CA and CB.

Figure 4:
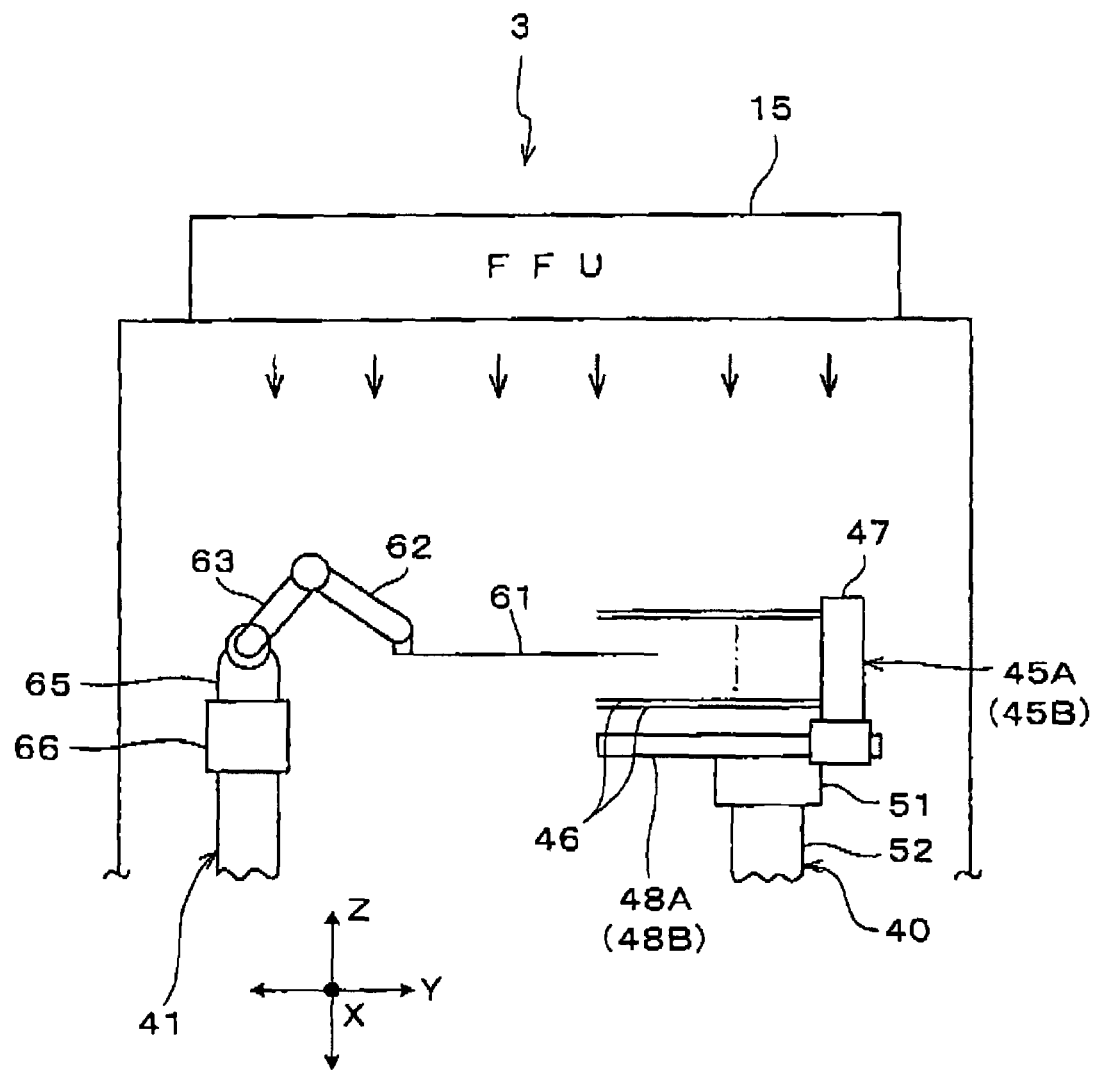
FIG. 4 is a front view schematically showing an interior of a transfer unit shown in FIG. 1.

As shown in FIGS. 1 and 4, the wafer transfer unit 3 has a plural-wafer conveyer 40 and a single-wafer conveyer 41. The plural-wafer conveyer 40 is adapted to load and unload a plural number of wafers W to and from the carrier CA, and adapted to convey the wafers W while they are spaced at predetermined intervals. The single-wafer conveyer 41 is adapted to load and unload the monitor wafers MW one by one to and from the carrier CB. The single-wafer conveyer 41 is also adapted to deliver and remove the wafer W and the monitor wafer MW to and from the plural-wafer conveyer 40. In the illustrated embodiment, plural-wafer conveyer 40 is adapted to access all the tables (25A and 25B) to handle wafers contained in the carriers placed on the tables (25A and 25B). As shown in FIG. 1, a rack 42 is arranged beside the single-wafer conveyer 41. The rack 42 serves as a wafer storage where wafers W removed from the plural-wafer conveyer 40 by the single-wafer conveyer 41 stand by.

In the illustrated embodiment, the single-wafer conveyer 41 is adapted to access a carrier placed on the nearest table (25B), but is not adapted to access the far table (25A). The single-wafer conveyer 41 is adapted to access the plural-wafer conveyer 40 and the rack 42, but is not adapted to access the processing unit 5. The aforementioned access ability of the single-wafer conveyer 41 achieves the small size and the simple structure of the single-wafer conveyer 41.

Figure 5:
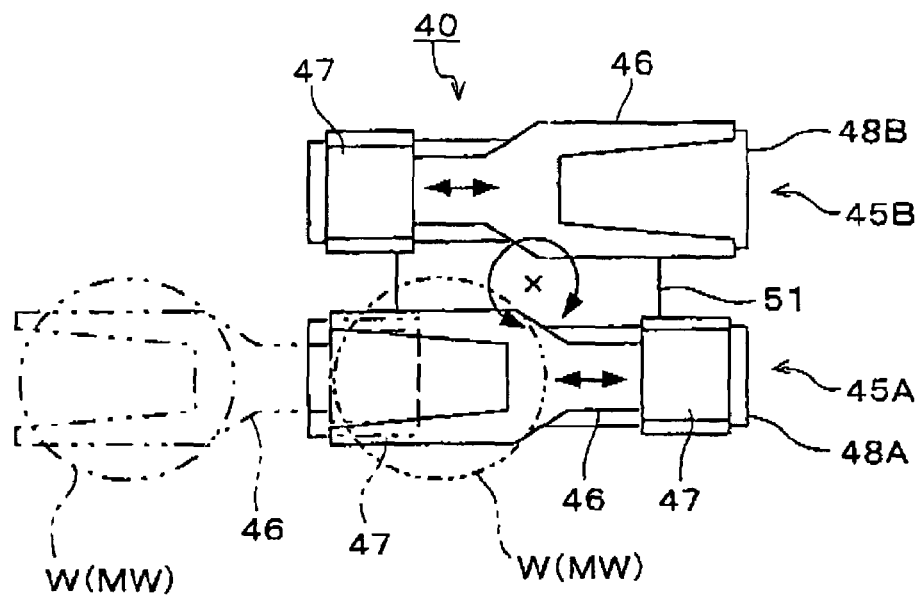
FIG. 5 is a top plan view of a plural-wafer conveyer shown in FIG. 4.
Figure 6:
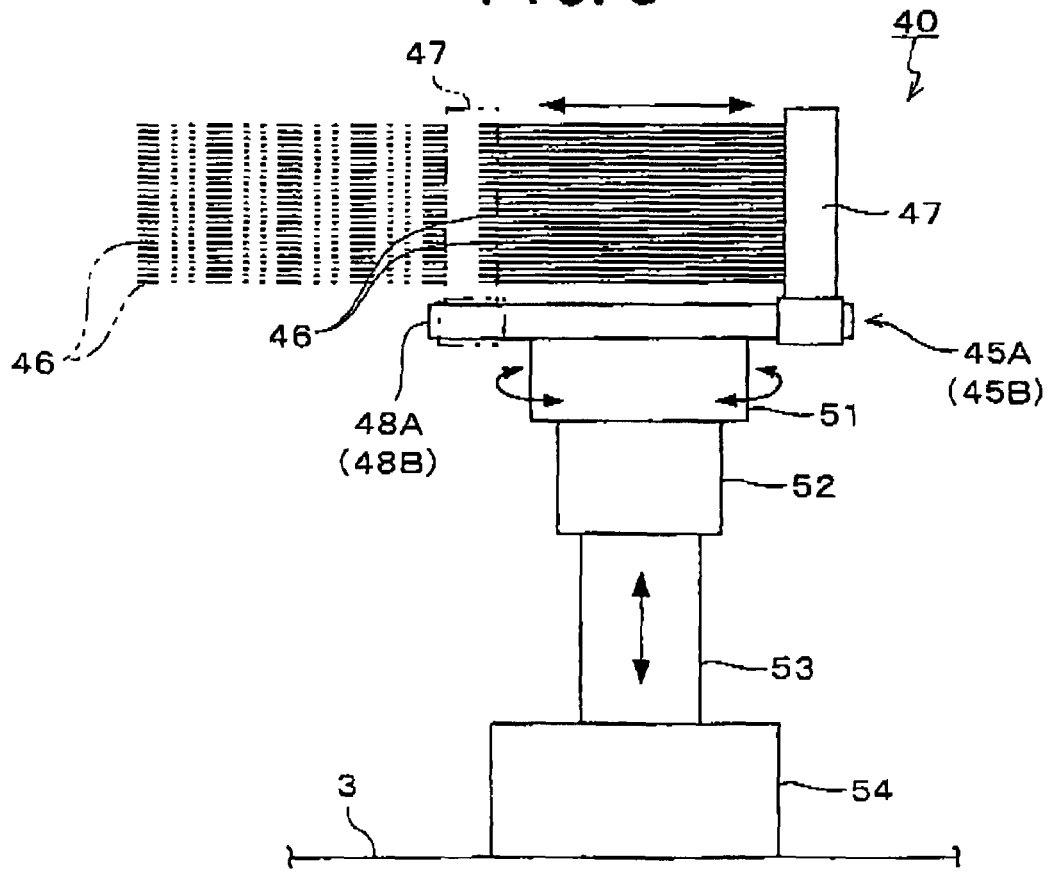
FIG. 6 is a side view of the plural-wafer conveyer.

As shown in FIG. 5, the plural-wafer conveyer 40 has two carrying arm sets 45A and 45B, each of which is adapted to hold twenty-five wafers W collectively while the wafers W are arranged substantially parallel with each other and spaced at predetermined intervals. As shown in FIG. 6, each of the sets 45A and 45B has twenty-five carrying arms 46 (i.e., wafer holding members) each adapted to hold one wafer W thereon in a substantially horizontal posture. In each carrying arm set (45A, 45B), the twenty-five carrying arms 46 are mounted to an arm holder 47 while the carrying arms 46 are in substantially horizontal posture, aligned in a vertical direction, and vertically spaced at predetermined intervals. The arm holders 47 of the carrying arm sets 45A and 45B are respectively supported by slide mechanisms 48A and 48B which horizontally slide the respective arm holders 47. Both of the slide mechanisms 48A and 48B are supported by a table 51 supported by a rotation mechanism 52. The rotation mechanism 52 rotates the table 51 about a vertical rotation axis. As shown in FIG. 5, the carrying arm set 45A and the slide mechanism 48A, and the carrying arm set 45B and the slide mechanism 48B are arranged in a point-symmetric relationship with respect to the rotation axis of the table 51. As shown in FIG. 6, the rotation mechanism 52 is supported by an elevating mechanism 53 which vertically moves the rotation mechanism 52. The elevating mechanism 53 is supported by a horizontal moving mechanism 54 which moves the elevating mechanism 53 in a horizontal direction (X-axis direction in FIG. 1). The horizontal moving mechanism 54 is fixed to a bottom of the wafer transfer unit 3.

When driving the horizontal moving mechanism 54, the elevating mechanism 53 horizontally moves integrally with the carrying arm sets 45A and 45B, the slide mechanisms 48A and 48B, the table 51 and the rotation mechanism 52. When driving the elevating mechanism 53, the rotation mechanism 52 vertically moves integrally with the carrying arm sets 45A and 45B, the slide mechanisms 48A and 48B and the table 51. When driving the rotation mechanism 52, the table 51 rotates about its vertical rotational axis integrally with the carrying arm sets 45A and 45B and the slide mechanisms 48A and 48B. When driving the slide mechanism 48A, the twenty-five carrying arms 46 of the carrying arm set 45A horizontally slide integrally with the corresponding arm holder 47. When driving the slide mechanism 48B, the twenty-five carrying arms 46 of the carrying arm set 45B horizontally slides integrally with the corresponding arm holder 47 in a direction opposite to that in which carrying arms 46 of the carrying arm set 45A slide.

According to the above structure, each of the carrying arm sets 45A and 45B of the plural-wafer conveyer 40 is capable of collectively holding twenty-five wafers W while they are spaced at predetermined intervals, by holding one wafer by each of the carrying arms 46. The plural-wafer conveyer 40 operates in such a manner that: each of the carrying arm sets 45A and 45B of the plural-wafer conveyer 40 collectively removes twenty-five wafers W from the carrier CA; delivers the twenty-five wafers W thus removed to a rotor assembly 85 (described later) which is a substrate holding mechanism of the processing unit 5; removes the twenty-five wafers W collectively from the rotor assembly 85; and collectively delivers the twenty-five wafers W into the carrier CA.

Figure 7:
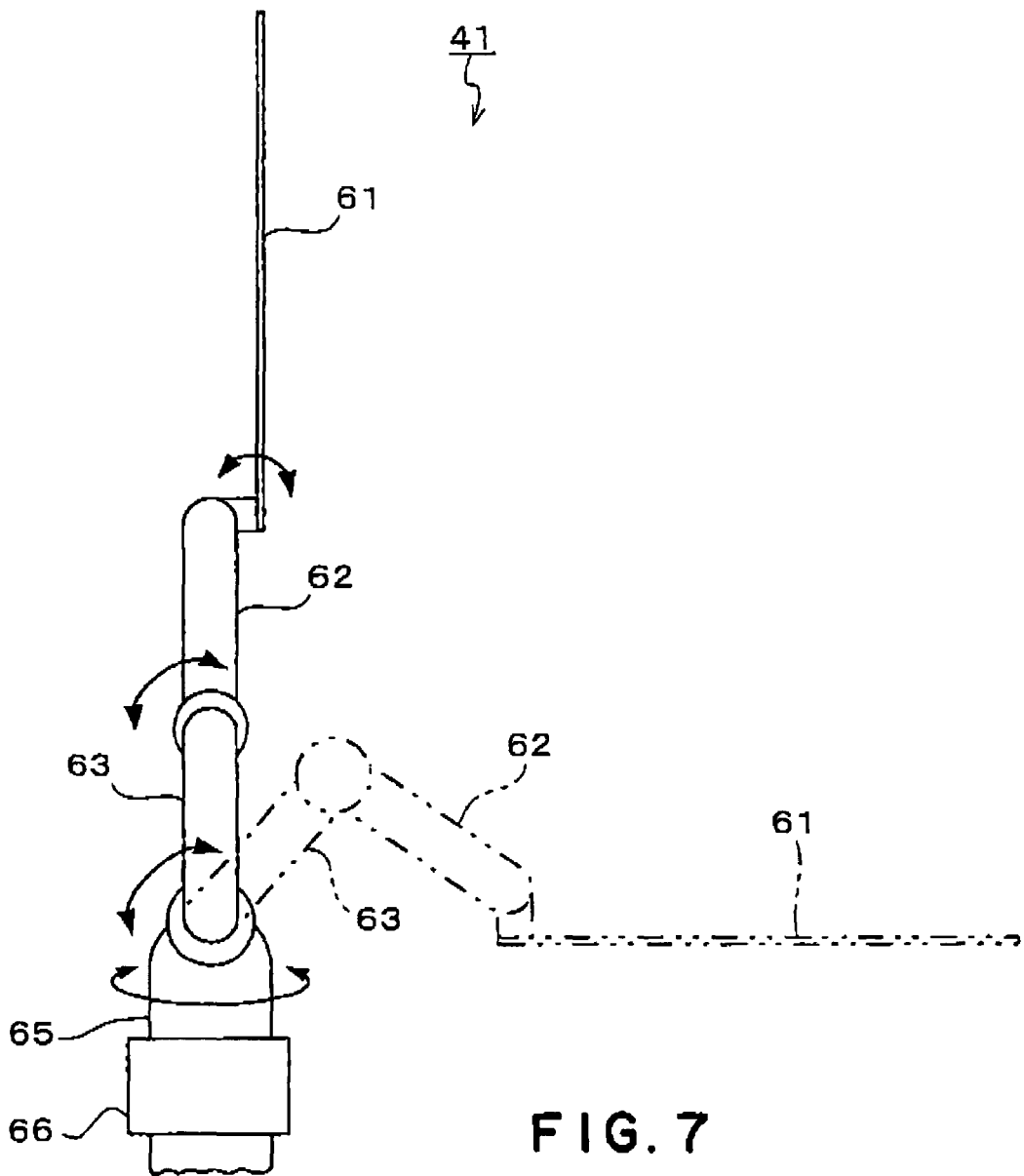
FIG. 7 is a side view of a single-wafer conveyer shown in FIG. 4.

As shown in FIG. 7, the single-wafer conveyer 41 is an articulated robot composed of: a single-wafer carrying arm 61 arranged in a substantially horizontal posture; a first support arm 62 which supports an end of the single-wafer carrying arm 61; a second support arm 63 which supports an end of the first support arm 62; and a support member 65 which supports an end of the second support arm 63. The support member 65 is supported by a rotation mechanism 66 which rotates the support member 65 about a vertical rotational axis. The single-wafer conveyer 41 also has a single-wafer carrying arm driving mechanism (not shown), a first support arm driving mechanism (not shown), and a second support arm driving mechanism (not shown). The single-wafer carrying arm driving mechanism rotates the single-wafer carrying arm 61 about a horizontal rotational axis arranged at a tip of the support arm 62. The first support arm driving mechanism rotates the support arm 62 about a tip of the support arm 63 in a vertical plane. The second support arm driving mechanism rotates the support arm 63 about a tip of the support member 65 in a vertical plane.

When driving the rotation mechanism 66, the support member 65 rotates about its rotational axis integrally with the single-wafer carrying arm 61, the first support arm 62 and the second support arm 63. When driving the second support arm driving mechanism (not shown), the second support arm 63 rotates about its horizontal rotational axis integrally with the single-wafer carrying arm 61 and the first support arm 62. When driving the first support arm driving mechanism (not shown), the first support arm 62 rotates about its horizontal rotational axis integrally with the single-wafer carrying arm 61. Thus, the single-wafer carrying arm 61 can move vertically while maintaining its substantially horizontal posture, by appropriately controlling the operations of the second support arm driving mechanism (not shown), the first support arm driving mechanism (not shown) and the single-wafer carrying arm driving mechanism. (not shown). Moreover, the single-wafer carrying arm 61 can move horizontally while maintaining its substantially horizontal posture, by appropriately controlling the operations of the rotation mechanism 66, the second support arm driving mechanism (not shown), the first support arm driving mechanism (not shown) and the single-wafer carrying arm driving mechanism (not shown).

When halting the operation of the single-wafer conveyer 41, it may stand by while the single-wafer carrying arm 61, the first support arm 62, and the second support arm 63 are directed to a vertical direction, as shown by solid lines in FIG. 7. This arrangement of the arms prevents the downflow air from the FFU 15 in the wafer transfer unit 3 from being interfered with by the single-wafer conveyer 41.

Figure 8:
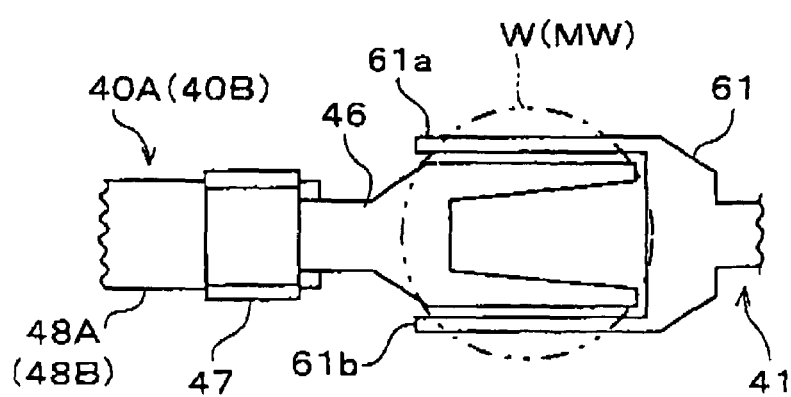
FIG. 8 is a top plan view of carrying arms of the plural- and single-wafer conveyers.

As shown in FIG. 8, the single-wafer carrying arm 61 has a substantially U-shape, and is provided with two fingers 61a and 61b extending parallel with each other. Each of the carrying arms 46 of the plural-wafer conveyer 40 can pass through a space between the fingers 61a and 61b. If the single-wafer carrying arm 61 moves into a space below the carrying arm 46 holding a substrate W thereon and then moves upward, the fingers 61a and 61b contact a lower surface of the wafer W and then the lower surface of the wafer W separates from the carrying arm 46 so that the single-wafer carrying arm 61 receives the wafer W from the carrying arm 46. Thereafter, by withdrawing the single-wafer carrying arm 61 from the carrying arm 46, the wafer W can be removed from the carrying arm set 45A or 45B.

The single-wafer conveyer 41 is capable of removing a monitor wafer MW from any one of the slots 21 of the carrier CB, and putting a monitor wafer W in any one of slots 21 of the carrier CB. The single-wafer conveyer 41 is also capable of removing a wafer W from any one of the carrying arms 46 of the carrying arm set 45A or 45B of the plural-wafer conveyer 40 which has been rotated to oppose the single-wafer conveyer 41, and is capable of delivering a wafer W or a monitor wafer MW to any one of the carrying arms 46. The single-wafer conveyer 41 is also capable of delivering a wafer W removed from one of the carrying arms 46 to any holding position of the rack 42, and capable of removing a wafer W from any holding position of the rack 42, That is, In the course of conveying a plurality of wafers W by the plural-wafer conveyer 40 from the carrier CA to the rotor assembly 85 of the processing unit 5, replacement of some wafers W with the monitor wafers MW can be automatically carried out by the single-wafer conveyer 41. In addition, in the course of conveying a plurality of wafers W together with monitor wafers MW by the plural-wafer conveyer 40 from the rotor assembly 85 of the processing unit 5 to the carrier CA, the monitor wafers MW can be automatically removed from the single-wafer conveyer 41. Due to the provision of the single-wafer conveyer 41 accessible to the plural-wafer conveyer 40, the wafer transferring efficiency, and thus the throughput of the processing system 1, is improved.

As shown In FIG. 2, the processing unit 5 has a wafer conveying-and-posture-changing area 75 (hereinafter simply referred to as "posture changing area") In which wafers W are conveyed and the posture of the wafers W is change. A substrate processing device 76, which encloses the wafers W and feeds a processing liquid to the wafers W, is arranged in the processing unit 5. The posture changing area 75 is disposed between the wafer transfer unit 3 and the substrate processing device 76.

The wafer transfer unit 3 and the posture changing area 75 are separated from each other by a partition wall 80, in which a window 81 is formed to allow the wafers W to be carried into and out of the posture changing area 75. A shutter 82 is arranged beside the partition wall 80 to close the window 81 in order to separate the atmosphere in the wafer transfer unit 3 from that of the posture changing area 75. Thus, even when a processing liquid atmosphere is diffused in the processing unit 5, the pollution of the wafer transfer unit 3 is prevented.

As shown in FIG. 1, the posture changing area 75 is provided with: the rotor assembly 85 serving as a substrate holding mechanism which holds twenty-five wafers W; a posture changing mechanism 86 which supports the rotor assembly 85 and controls the posture thereof; and a rotor assembly moving mechanism 87 which moves the rotor assembly 85 and the posture changing mechanism 86 in the X and Y directions.

As shown in FIG. 2, the rotor assembly 85 has a motor 90 with a rotation shaft 91, and a rotor 92 which is fixed to a tip of the rotation shaft 91. The rotor 92 is adapted to hold twenty-five wafers W while the wafers W are aligned in a row, arranged in parallel to each other, and spaced at predetermined intervals. The motor 90 is supported by a casing 93, which surrounds the rotation shaft 91. The casing 93 is supported by the posture changing mechanism 86 shown in FIG. 1. A disc-shaped lid 95 is arranged between the casing 93 and the rotor 92.

Figure 9:
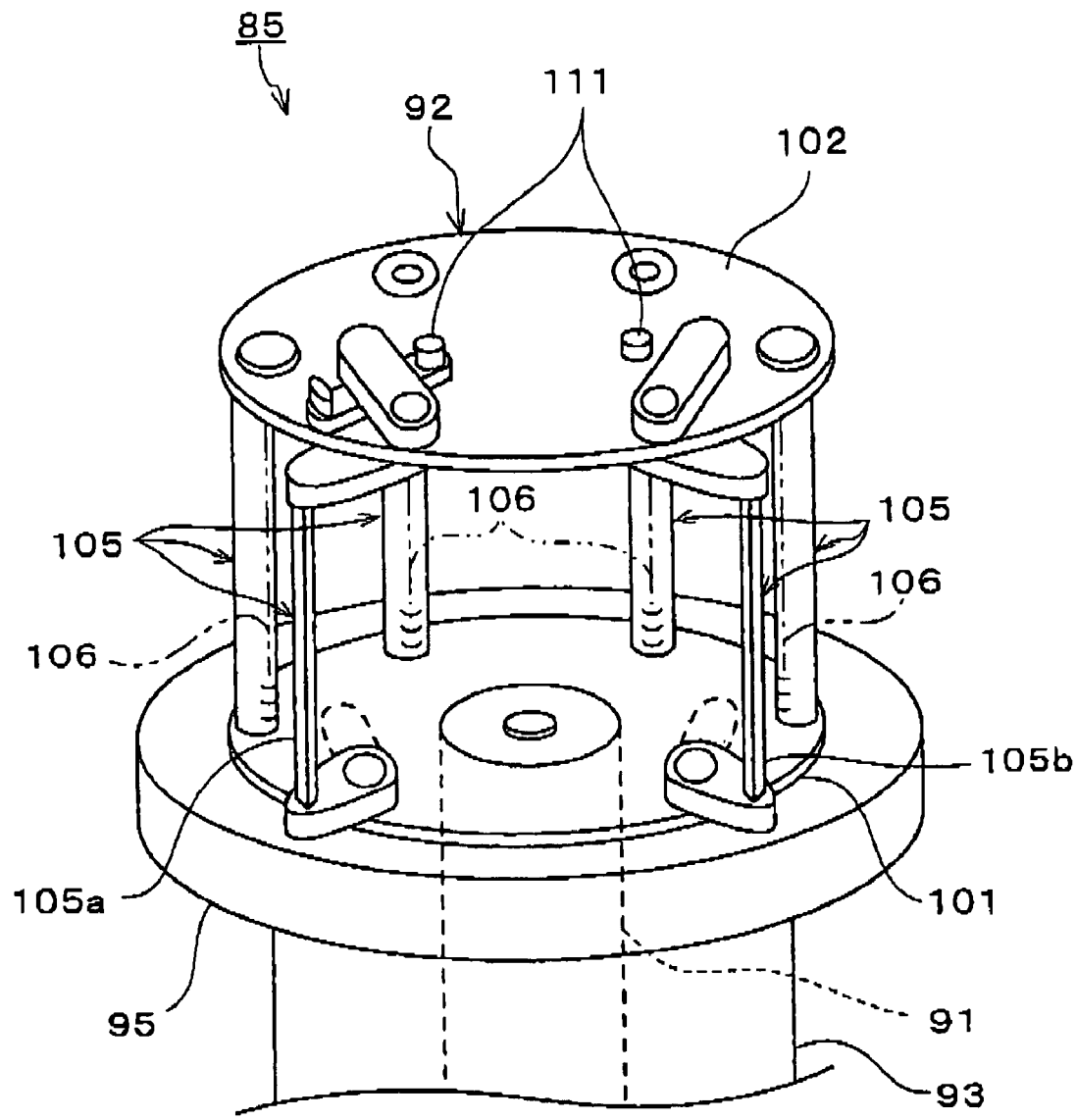
FIG. 9 is a perspective view of a rotor arranged in a processing unit shown in FIG. 1.

As shown in FIG. 9, the rotor 92 has a pair of discs 101 and 102 which are spaced from each other in order that twenty-five wafers W can be inserted therebetween, and six holding rods 105 whose ends are supported by the discs 101 and 102. The disc 101 is fixed to a tip of the rotation shaft 91. The disc 102 is arranged substantially in parallel with the disc 101. The six holding rods 105 are arranged in parallel to the rotation shaft 91, and are arranged on a circumference having a center coinciding with the center of the rotation shaft 91.

Each of the holding rods 105 has twenty-five holding grooves 106, which are spaced at predetermined intervals, and to which peripheries of the wafers W are inserted. The rotor 92 holds the twenty-five wafers W substantially In parallel with each other, by supporting the peripheries of the wafers W by the holding grooves 106 of the six holding rods 105. The intervals of the holding grooves 106 is the same as those of the slots 28 (see FIG. 3) of the carriers CA and CB, and those of the carrying arms 46 (see FIG. 6) of the carrying arm sets 45A and 45B. Thus, the carriers CA and CB, the carrying arm sets 45A and 45B, and the rotor 92 are adapted to hold the twenty-five wafers W while the wafers W are spaced at the same intervals. The respective holding grooves 106 are formed of fluorocarbon resin such as PTFE (polytetrafluoroethylene).

Figure 10:
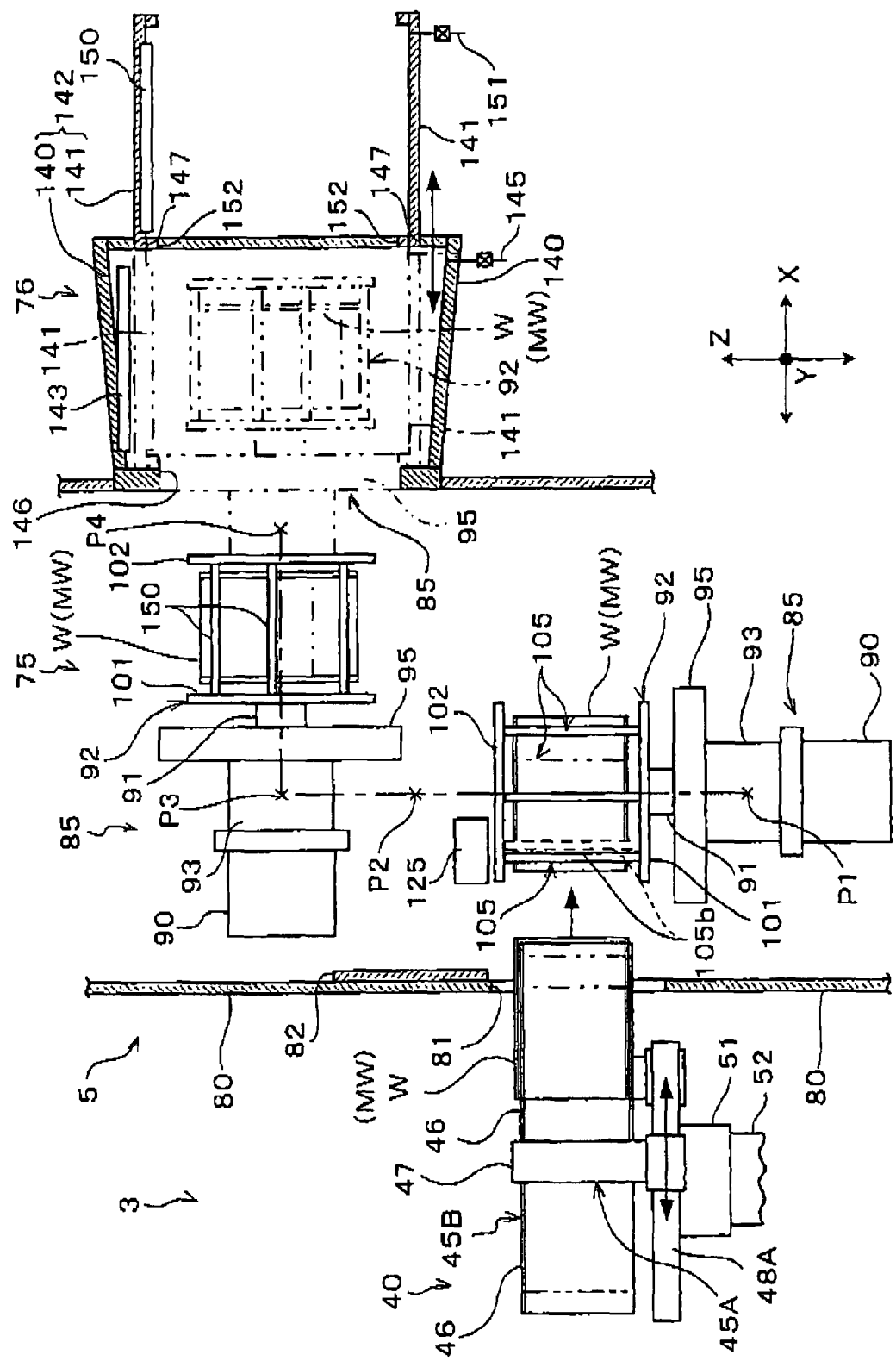
FIG. 10 is a side view schematically showing the structure of the processing unit.

As shown in FIG. 10, two adjacent holding rods 105a and 105b of the six holding rods 105 are capable of rotation. Locking pins 111 are arranged on an outer surface (a surface not facing the wafers W) of the disc 102 to prevent the swing motion of the holding rods 105a and 105b. When the wafers W are loaded to and unloaded from the rotor 92, the locking pins 111 are released in order to allow the holding rods 105 and 105b to separate from each other.

As shown in FIG. 10, the posture changing mechanism 86 is capable of changing posture of the rotor assembly 85 between a vertical posture in which the wafers W are held horizontally and a horizontal posture in which the wafers W are held vertically. In the vertical posture, the rotor assembly 85 is held by the posture changing mechanism 86 such that the rotor 92 is positioned above the motor 90. In the horizontal posture, the rotor assembly 85 is held by the posture changing mechanism 86 such that the rotor 92 faces the substrate processing device 76 while the motor 90 faces the wafer transfer unit 3.

As shown in FIG. 10, the rotor assembly moving mechanism 87 can vertically (in Z-axis direction) move the rotor assembly 85 held in the vertical posture, and horizontally (in X-axis direction) move the rotor assembly 85 held in the horizontal posture. The rotor assembly 85 is moved by the rotor assembly moving mechanism 87 from position P1 to position P4. In a wafer loading-and-unloading position P1, the rotor assembly 85 is held in the vertical posture, and the rotor 92 opposes the carrying arm set 45A or 45B thorough the window 81. In a posture changing position P2, the posture of the rotor assembly 85 is changed from the vertical posture to the lateral posture so that the rotor 92 faces the substrate processing device 76. In a standby position P3, the rotor assembly 85 is held in the horizontal posture, and the rotor 92 just opposes the substrate processing device 76. In a processing position P4, the rotor assembly 85 is held in the horizontal posture, and the rotor 92 is in the substrate processing device 76.

An opening-and-closing mechanism 125 is arranged in the posture changing area 75 to turn the movable holding rods 105a and 105b and to operate (lock and unlock) the locking pins 111. When the rotor assembly 85 is in the wafer loading-and-unloading position P1, the locking pins 111 arranged on the disk 102 of the rotor 92 is directed upward. The opening-and-closing mechanism 125 accesses a movable holding rod turning mechanism (not shown in detail) and the locking pins 111 from above the disk 102 to operate them.

Figure 11:
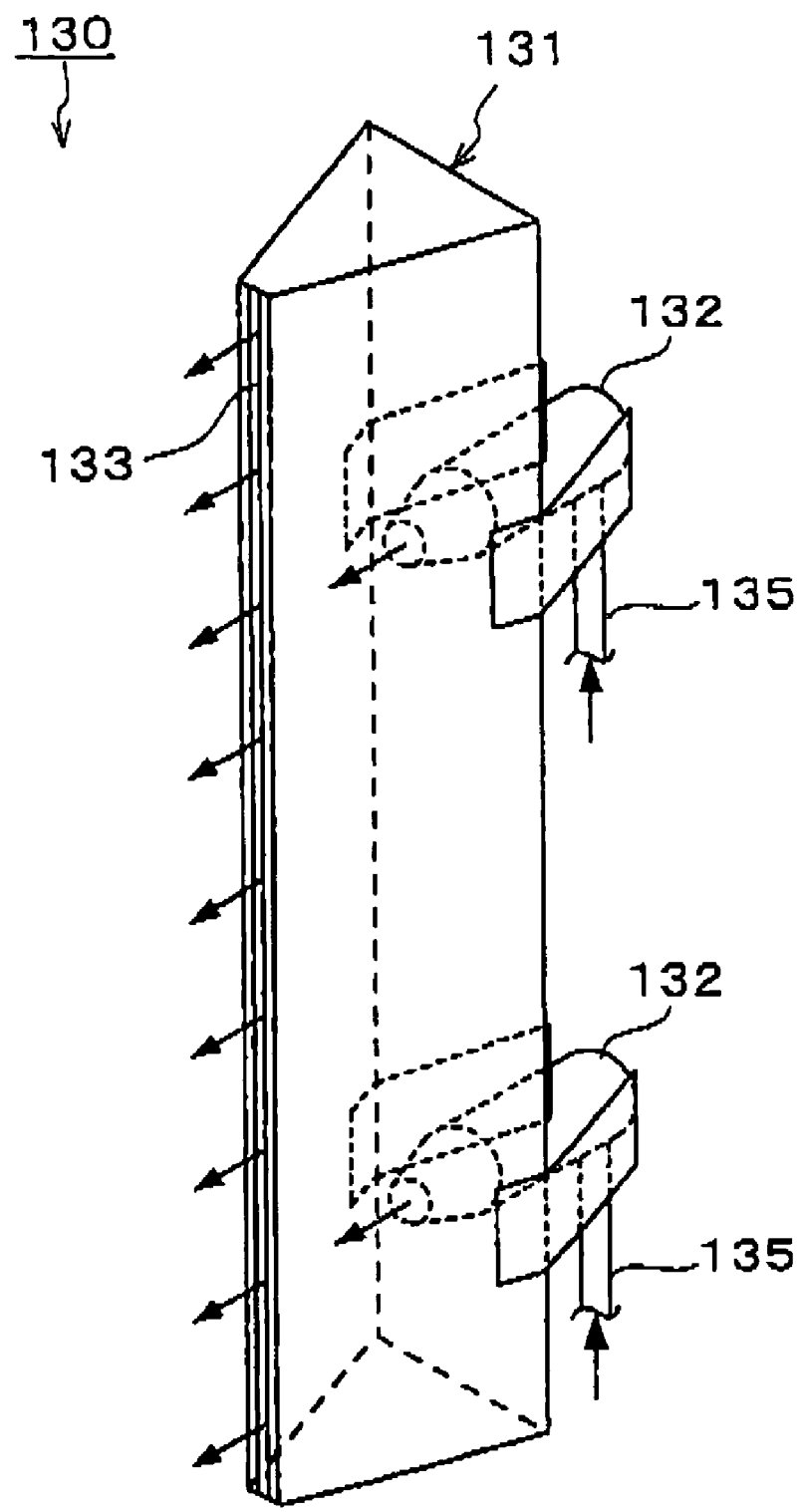
FIG. 11 is a perspective view of a charge eliminator arranged in the processing unit shown in FIG. 1.
Figure 12:
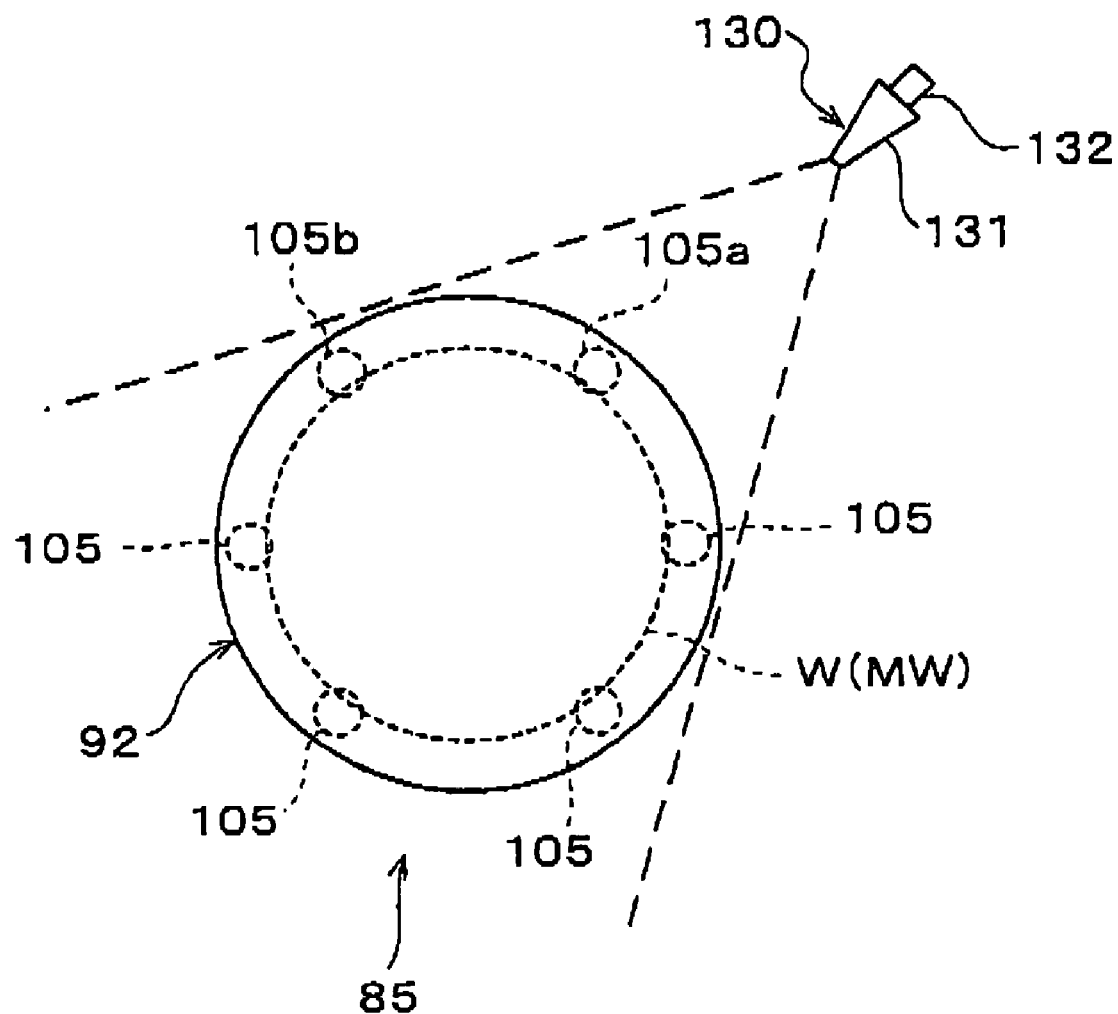
FIG. 12 is a top plan view of the rotor and the charge eliminator for explaining the operation of the charge eliminator.

As shown in FIG. 1, in the posture changing area 75, a charge eliminator 130 for eliminating static electrical charge from the wafers W is disposed near the window 81. As shown in FIG. 11, the charge eliminator 130 has a nozzle 131 for discharging an ionized nitrogen gas ($N_2^+$), and at least one ionizer 132 for supplying the ionized nitrogen gas into the nozzle 131. The nozzle 131 is of a hollow vertically elongated box shape having a pair of sides converging toward the rotor 92 (see FIG. 1) to which the ionized nitrogen gas is to be jetted from the nozzle 131. The nozzle 131 has a front side facing the rotor 92 and having vertically extending slits 133. In the illustrated embodiment, two ionizers 132 are arranged on a back side of the nozzle 131 to oppose the slits 133. A supply pipe 135 for supplying nitrogen gas ($N_2$) is connected to each of the ionizers 132. Each of the ionizers 132 is provided therein with an electrode (not shown) for discharging electricity. A nitrogen gas supplied to each ionizer 132 through each supply pipe 135 is ionized by electric discharge. The ionized nitrogen gas is supplied to the cavity of the nozzle 131, and is jetted through the slits 133 toward the entire rotor 92, as shown in FIG. 12. Alternatively, instead of the nitrogen gas, dry air may be supplied to each ionizer 132 through the supply pipe 135, and the ionized air may be used as an ionized gas for charge elimination.

As show in FIG. 10, the substrate processing device 76 includes a dual chamber structure 142 having an outer chamber (i.e., outer casing) 140 and an inner chamber (i.e., inner casing) 141. The inner chamber 141 is adapted to move horizontally between a position where the inner chamber 141 is located in the outer chamber 140 and a position where the inner chamber 141 is located outside the outer chamber 140. A processing fluid discharging nozzle 143 is arranged at an upper part of the outer chamber 140 to supply deionized water (DIW). An exhaust port 145 is arranged at the bottom of the outer chamber 140. The outer chamber 140 has a rotor port 146 and an inner chamber port 147. The rotor 92 enters and exits the outer chamber 140 through the rotor port 146. The inner chamber 141 enters and exits the outer chamber 140 through the inner chamber port 147. A processing fluid discharging nozzle 150 is arranged at an upper part of the inner chamber 141 to supply a chemical and IPA (isopropyl alcohol). An exhaust port 151 is arranged at the bottom of the inner chamber 141. The inner chamber 141 has a rotor port 152 which allows the inner chamber 140 to move relatively to the rotor 92 between a position where the inner chamber 140 encloses the rotor 92 located in the outer chamber 140 and a position where the inner chamber 140 located outside the outer chamber 140.

A method of processing a plurality of wafers W together with monitor wafers MW (hereinafter referred to as "mix process") by using the processing system 1 will be described. It should be noted that the processing system 1 usually performs a normal batch process by which only the wafers W (not including the monitor wafer MW) are processed. The processing system 1 performs the mix process, which is described later, only when requested. As shown in FIG. 1, the carrier CA which holds twenty-five wafers W spaced at predetermined intervals is placed on the carrier table 25A by a not-shown external carrier conveyer, and the opening 22 of the carrier CA is positioned in the window 27A. The carrier CB which holds twenty-five monitor wafers MW spaced at predetermined intervals is placed on the carrier table 25B by the not-shown external carrier conveyer, and the opening of the carrier CB is positioned in the window 27B. The not-shown shutter elevating mechanism is driven to remove the lid 23 of the carrier CA from the opening 22 and moves the lid 23 together with the shutter 30A. Similarly, the shutter elevating mechanism (not shown) is driven to remove the lid 23 of the carrier CB from the opening 22 together with the shutter 30B.

As shown in FIG. 2, the horizontal moving mechanism 54 of the plural-wafer conveyer 40 is driven to move the carrying arm set 45A to a Y position (defined by the Y axis) where the window 27A is located. The elevating mechanism 53 is driven to locate the carrying arm set 45A at a height where the window 27A is located. The rotation mechanism 52 is driven to direct the carrying arm set 45A toward the window 27A. The slide mechanism 48A is driven to move the carrying arm set 45A in the X-axis direction, so that the carrying arms 46 of the carrying arm set 45A enter the carrier CA through the window 27A and the opening 22. Each carrying arm 46 of the carrying arm set 45A moves to a position below each wafer W contained in the carrier CA. Then, the elevating mechanism 53 is driven to slightly raise the carrying arm set 45A so that the lower surface of each wafer W is supported by each carrying arm 46. The slide mechanism 48A is driven to withdraw the carrying arms 46 from the carrier CA in the X-axis direction through the opening 22, whereby the wafers W are taken out from the slots 21. In this way, the twenty-five wafers W are held by the carrying arms 46 of the carrying arm set 45A while the wafers W are spaced at the predetermined intervals, and the wafers W are removed from the carrier CA collectively.

Then, the rotation mechanism 52 is driven to rotate the carrying arm set 45A holding the twenty-five wafers W about ninety degrees clockwise (viewed from above), so that the carrying arms 46 holding the wafers W are facing the single-wafer conveyer 41. The single-wafer carrying arm 61 of the single-wafer conveyer 41 moves in the Y-axis direction, so that the single-wafer carrying arm 61 locates at a position below one of the wafers W held by one of the carrying arms 46 of the carrying arm set 45A (e.g., a wafer W held by the uppermost carrying arm 46 of the carrying arm set 45A). The single-wafer carrying arm 61 slightly rises to support the lower surface of the wafer W, and then withdraws from the carrying arm set 45A in the Y-axis direction. In this way, the single-wafer carrying arm 61 receives the wafer W from the uppermost carrying arm 46. Then, the single-wafer carrying arm 61 moves upward while maintaining the posture of the wafer W horizontally, and transfers the wafer W to the rack 42 shown in FIG. 1.

After delivering the wafer W to the rack 42, the single-wafer carrying arm 61 moves toward the window 27B shown in FIG. 1, and then moves in the X-axis direction to enter the carrier CB. The single-wafer carrying arm 61 moves to a position below a predetermined monitor wafer MW held by the carrier CB, rises slightly to support a lower surface of the monitor wafer MW, and withdraws in the X-axis direction from the carrier CB, so that the monitor wafer MW is taken out from the corresponding slot 21 of the carrier CB. In this way, a single monitor wafer MW is removed from the carrier CB by the single-wafer carrying arm 61.

Then, the single-wafer carrying arm 61 supporting the monitor wafer MW moves toward the carrying arm set 45A while maintaining the posture of the monitor wafer MW horizontally, and moves in the Y-axis direction to locate at a position above the uppermost carrying arm 46 of the carrying arm set 45A from which the wafer W has been removed. Then, the single-wafer carrying arm 61 is lowered to a position slightly below the uppermost carrying arm 46, thereby the monitor wafer MW leaves the single-wafer carrying arm 61 and is supported by the carrying arm 46. The single-wafer carrying arm 61 withdraws from below the uppermost carrying arm 46 in the Y-axis direction. Thus, the monitor wafer MW is delivered to the uppermost carrying arm 46.

After the monitor wafer MW is delivered to the uppermost carrying arm 46, the single-wafer carrying arm 61 descends in the Z-axis direction, and moves to a position below a predetermined wafer W (e.g., a wafer W held by the thirteenth carrying arm 46 from the top). Then, the single-wafer carrying arm 61 removes the thirteenth wafer W from thirteenth carrying arm 46 of the carrying arm set 45A in the same way as previously mentioned, and delivers the thirteenth wafer W to the rack 42. Then, the single-wafer carrying arm 61 removes another predetermined monitor wafer MW contained in the carrier CB and transfers it to the thirteenth carrying arm 46 of the carrying arm set 45A in the same way as previously mentioned.

After delivering the monitor wafer MW to the thirteenth carrying arm 46 of the carrying arm set 45A, the single-wafer carrying arm 61 descends In the Z-axis direction, and moves to a position below a predetermined wafer W (e.g., a wafer W held by the lowermost carrying arm 46 of the carrying arm set 45A). Then, the single-wafer carrying arm 61 removes the lowermost wafer W from the lowermost carrying arm 46 of the carrying arm set 45A in the same way as previously mentioned, and delivers the lowermost wafer W to the rack 42. Then, the single-wafer carrying arm 61 removes another predetermined monitor wafer MW contained in the carrier CB and transfers it to the lowermost carrying arm 46 of the carrying arm set 45A in the same way as previously mentioned. In this way, three (i.e., uppermost, thirteenth, and lowermost ones) of the twenty-five wafers W supported by the carrying arm set 45A are replaced with the monitor wafers MW.

Then, the rotation mechanism 52 is driven to rotate the carrying arm set 45A supporting the twenty-two wafers W and the three monitor wafers MW about ninety degrees clockwise (viewed from above), thereby the carrying arms 46 holding the wafers W and the monitor wafers MW faces the window 81.

Referring to FIG. 10, the rotor assembly 85 is standing by at the loading-and-unloading position P1 in the posture changing area 75. The locking pins 111 are released by the opening-and-closing mechanism 125, and thus the holding rods 105a and 105b are opened.

The shutter 82 moves to open the window 81, and the slide mechanism 48A is driven to move the carrying arm set 45A in the X-axis direction. Then, the carrying arm set 45A holding the wafers W and the monitor wafers MW moves into the posture changing area 75 through the window 81, and moves into the rotor 92 through the space between the holding rods 105a and 105b. At this time, the charge eliminator 130 (see FIGS. 1 and 11.) starts to jet the ionized gas through the slit 133 toward the rotor 92 in order to eliminate electrostatic charge from the wafers W and the monitor wafers MW. Thus, even if the periphery of the wafer W contacts the holding groove 106 made of fluorocarbon resin, the charging of the wafers W can be prevented, and therefore breakage, due to the electrostatic charge, of the semiconductor device formed on the surface of each wafer W is prevented.

The carrying arms 46 holding the wafers W and the monitor wafers MW move into a space surrounded by the six holding rods 105. When the peripheries of the wafers W and the monitor wafers W are inserted in the holding grooves 106 formed in the four holding rods 105, the holding rods 105a and 105b are closed so that the wafers W and the monitor wafers MW are held by the holding grooves 106 of the six holding rods 105. Then, the carrying arms 46 slightly descend to leave the wafers W and the monitor wafers MW, and withdraw from the rotor 92 in the X-axis direction through the spaces between adjacent wafers (W and W, and W and MW). In this way, the twenty-two wafers W and the three monitor wafers MW are collectively moved into the posture changing area 75, and are collectively loaded to the rotor 92, by the carrying arm set 45A. After the carrying arms 46 withdraw from the posture changing area 75 through the window 81, the window 81 is closed by the shutter 82.

The locking pins 111 are locked by the opening/closing mechanism 125. The rotor assembly moving mechanism 87 is driven to elevate the rotor assembly 85 toward the posture changing position P2. When the rotor assembly 85 starts to elevate, the charge eliminator 130 stops the discharge of the ionized gas. When the rotor assembly is moved to the posture changing position P2, the posture changing mechanism 86 is driven to change the posture of the rotor assembly 85 from the vertical posture to the horizontal posture so that the rotor 92 faces the processing device 87. Then, the rotor assembly moving mechanism 87 is driven to elevate the rotor assembly 85 to the standby position P3.

In the substrate processing device 76, the inner chamber 141 positions inside the outer chamber 142 as indicated by double-dashed chain lines in FIG. 10. A lid (not shown) closing the rotor port 146 moves to open the rotor port 146. Then, the rotor assembly 85 located at the standby position P3 moves horizontally (in the X-axis direction) so that the rotor 92 moves into the inner chamber 141 through the rotor port 146. The rotor assembly 85 is finally moved to the processing position P4, at which the rotor 92 is in a predetermined position in the inner chamber 141 and the rotor port 146 is closed by the lid body 95, as indicated by double-dashed chain lines in FIG. 10. Thus, a sealed processing space is established inside the inner chamber 141.

The motor 90 is driven to rotate the rotor 92 at a predetermined rotational speed, so that the wafers W and the monitor wafers MW rotate together with the rotor 92. A chemical liquid, whose temperature is adjusted to a predetermined level, is jetted from the processing fluid discharging nozzle 150 to the wafers W and the monitor wafers MW which are rotating. Thus, a polymer adhered to the surfaces of the wafers W is dissolved, and the dissolved polymer is removed from the surfaces of the wafers W together with the chemical liquid. The chemical liquid supplied to the wafers W and the monitor wafers MW is drained from the inner chamber 141 through the exhaust port 151.

After the chemical process is completed, the rotor 92 rotates at a speed higher than that during the chemical process, so that the chemical liquid remaining on the wafers W, the monitor wafers MW and the rotor 92 is removed, or is spun off by a centrifugal force.

Next, an IPA rinse process is carried out by jetting IPA (isopropyl alcohol) to the rotating wafers W and the rotating monitor wafers MW. During this rinse process using the IPA, the rotor 92 is rotated at a speed lower than that during the chemical liquid spinning-off process. After the IPA rinse process is completed, the discharge of IPA is stopped, and the rotor 92 is rotated at a speed higher than that during the IPA rinse process so that the IPA remaining on the wafers W, the monitor wafers MW and the rotor 92 is removed, or is spun off by a centrifugal force.

Even after IPA on the wafers W, the monitor wafers MW and the rotor 92 dries, the rotor 92 continues to rotate. By rotating the wafers W for a long time after the IPA is supplied thereto, substances difficult to remove by the IPA such as residuals of a resist, and substances difficult to evaporate which are mixed in the chemical liquid or IPA can be efficiently removed from the surfaces of the wafers W. The IPA supplied to the wafers W and the monitor wafers MW is drained from the inner chamber 141 through the exhaust port 151.

The IPA rinse process and the succeeding spin process conducted for a long time are preferably carried out more than twice. Thus, substances difficult to remove and evaporate can be sufficiently removed from the surfaces of the wafers W.

After completion of the IPA rinse process and the succeeding spin process, the inner chamber is removed from the interior of the outer chamber 140 so as to form a sealed processing space enclosing the rotor 92 in the outer chamber 140. DIW (deionized water) is jetted from the processing fluid discharging nozzle 150 to the rotating wafers W and the rotating monitor wafers MW so as to carry out a DIW rinse process. DIW supplied to the wafers W and the monitor wafers MW is drained from the outer chamber 141 through the exhaust port 145.

After the DIW rinse process is completed, the rotor 92 is rotated at a speed higher than during the DIW rinse process, so that the wafers W and the monitor wafers MW are spin-dried. The spin-dry process may be carried out by jetting an inert gas such as a nitrogen gas, or by jetting IPA vapor having high volatility and hydrophilicity, from the processing fluid discharging nozzle 150 to the wafers W and the monitor wafers MW.

After the spin-dry process, the rotation of the rotor 92 is stopped. The rotor assembly moving mechanism 87 is driven to horizontally (in the X-axis direction) move the rotor assembly 85 to the standby position P3, so that the rotor 92 is removed from the interior of the dual chamber 142 through the rotor port 146. The rotor assembly 85 moves downward to the posture changing position P2, at which the posture of the rotor assembly 85 is changed from the horizontal posture to the vertical posture. Then, the rotor assembly 85 is moved downward to the loading-and-unloading position P1.

In the wafer transfer unit 3, the horizontal moving mechanism 54, the elevating mechanism 53, and the rotation mechanism 52 of the plural-wafer conveyer 40 are driven, so that the carrying arms 46 of the carrying arm set 45B are oppose the window 81. The shutter 82 moves to open the window 81. The slide mechanism 48B is driven to move the carrying arm set 45B in the X-axis direction, so that the carrying arms 46 move into the posture changing area 75 through the window 81. The carrying arms 46 of the carrying arm set 45B move to positions below the wafers W and the monitor wafers MW held by the rotor 92 through the holding rods 105$a$ and 105$b$. The elevating mechanism 53 is driven to slightly raise the carrying arm set 45B, so that the carrying arms 46 support the lower surfaces of the wafers W and the monitor wafers MW. Then, the locking pins 111 are released by the opening-and-closing mechanism 125 to open the holding rods 105$a$ and 105$b$ of the rotor 92 The slide mechanism 48B is driven to withdraw the carrying arms 46 from the rotor 92 through a space between the holding rods 105$a$ and 105$b$ in the X-axis direction, so that the wafers W and the monitor wafers MW are removed from the holding grooves 106 of the rods 105 of the rotor 92. In this way, the wafers W and the monitor wafers MW are collectively unloaded from the rotor 92 by the carrying arms 46 of the carrying arm set 45B.

As mentioned above, the carrying arms 46 of the carrying arm set 45A are exclusively used for handling the wafers W and the monitor wafers MW which are not processed (cleaned), and the carrying arms 46 of the carrying arm set 45B is exclusively used for handling the wafers W and the monitor wafers MW which have been processed (cleaned). Thus, particles or the like do not adhere to the processed wafers W and the processed monitor wafers MW.

After the wafers W and the monitor wafers MW held by the carrying arms 46 are withdrawn from the posture changing area 75 through the window 81, the window 81 is closed by the shutter 82.

When the wafers W and the monitor wafers MW are unloaded from the rotor 92, jetting of ionized gas to the wafers W and the monitor wafers MW by the charge eliminator 130 may be carried out, but may be omitted, because the wafers W are not likely to be charged.

The rotation mechanism 52 is driven to rotate the carrying arm set 45B supporting the wafers W and the monitor wafers MW about ninety degrees counter-clockwise (viewed from above), so that the carrying arms 46 of the carrying arm set 45B holding the wafers W and the monitor wafers MW face the single-wafer conveyer 41. The single-wafer carrying arm 61 of the single-wafer conveyer 41 moves in the Y-axis direction, and moves to a position below the monitor wafer MW held by the uppermost carrying arm 46 of the carrying arm set 45B. The single-wafer carrying arm 61 slightly rises to support a lower surface of the monitor wafer MW, and then moves in the Y-axis direction to withdraw from the carrying arm set 45B. Thus, the monitor wafer MW is removed from the uppermost carrying arm 46 by the single-wafer carrying arm 61. The single-wafer carrying arm 61 holding the monitor wafer MW moves toward the window 27B while maintaining posture of the monitor wafer MW horizontally. The single-wafer carrying arm 61 holding the monitor wafer MW moves into the carrier CB, and the monitor MW is inserted in the slot 21 of the carrier CB in which the monitor MW was inserted before it is processed. After the monitor wafer MW is held by the slot 21, the single-wafer carrying arm 61 withdraws from below the monitor wafer MW.

After the monitor wafer MW which was held by the uppermost carrying arm 46 is housed in the carrier CB, the monitor wafer MW held by the thirteenth carrying arm 46 of the carrying arm set 45B is removed by the single-wafer carrying arm 61 and is then housed In the carrier CB in the same way. Thereafter, the monitor wafer MW held by the lowermost carrying arm 46 of the carrying arm set 45B is removed by the single-wafer carrying arm 61 and is then housed in the carrier CB in the same way.

The rotation mechanism 52 is driven to rotate the carrying arm sets 45A and 45B about one hundred eighty degrees so that the carrying arms 46 of the carrying arm set 45A face the single-wafer conveyer 41. The single-wafer carrying arm 61 takes out the three unprocessed wafers W which are temporarily stored (or standing-by) in the rack 42 one by one, in order to transfer these three unprocessed wafers W one by one from the rack 42 to the carrying arms 46 of the carrying arm set 45A.

After the three unprocessed wafers W are transferred to three of carrying arms 46 of the carrying arm set 45A, the rotation mechanism 52 is driven to rotate the carrying arm set 45A about ninety degrees so that the carrying arms 46 holding the three wafers W face the window 81. The three wafers W are moved into the posture changing area 75 through the window 81, and are loaded to the rotor 92. Then, the three wafers W are subjected to the same cleaning processes as those performed for the twenty-two wafers W and the three monitor wafers MW mentioned above.

After the three wafers W are processed, the carrying arms 46 of the carrying arm set 45A receive the three wafers W from the rotor 92, and take them out of the posture changing area 75. In the wafer transfer unit 3, the rotation mechanism 52 is driven to rotate the carrying arm set 45A about ninety degrees counter-clockwise (viewed from above) so that the carrying arms 46 of the carrying arm set 45A holding the three wafers W face the single-wafer conveyer 41.

Then, one of the three wafers W held by the carrying arms 46 of the carrying arm set 45A is removed by the single-wafer carrying arm 61. The rotation mechanism 52 is driven to rotate the carrying arm sets 45A and 45B about one hundred eighty degrees so that the carrying arms 46 of the carrying arm set 45B holding the twenty-two wafers W face the single-wafer conveyer 41. The wafer W held by the single-wafer carrying arm 61 is delivered to one of three carrying arms 46, which does not hold wafer W, of the carrying arm set 45B. Then, the rotation mechanism 52 is driven to again rotate the carrying arm sets 45A and 45B about one hundred eighty degrees so that the carrying arms 46 of the carrying arm set 45A holding two wafers W face the single-wafer conveyer 41. One of the two wafers W held by the carrying arms 46 of the carrying arm set 45A is removed by the single-wafer carrying arm 61. The carrying arm sets 45A and 45B are rotated about one hundred eighty degrees so that the carrying arms 46 of the carrying arm set 45B holding twenty-three wafers W face the single-wafer conveyer 41. The wafer W held by the single-wafer carrying arm 61 is delivered to one of two carrying arms 46, which does not hold the wafer W, of the carrying arm set 45B. Similarly, the last wafer W held by the carrying arm 46 of the carrying arm set 45A is transferred from the carrying arm 46 of the carrying arm set 45A to the remaining carrying arm 46 of the carrying arm set 45B. In this way, the three wafers W are sequentially transferred from the carrying arms 46 of the carrying arm set 45A to the carrying arms 46 of the carrying arm set 45B.

After the twenty-five processed wafers W are held by the carrying arms 46 of the carrying arm set 45B, the rotation mechanism 52 is driven to rotate the carrying arm set 45B about ninety degrees counter-clockwise (viewed from above) so that the carrying arms 46 of the carrying arms set 45B holding the twenty-five wafers W face the window 27A. The slide mechanism 48B is driven, so that the carrying arms 46 holding the twenty-five wafers W enter the carrier CA through the opening 22, insert the wafers W into the slots 21 of the carrier CA, and descend to allow the wafers to be held by the slots 21. Thereafter, the carrying arms 46 withdraw from the spaces below the respective wafers W. In this way, the carrying arms 46 of the carrying arm set 45B put the twenty-five wafers W in the carrier CA collectively.

Thereafter, the shutter elevating mechanism (not shown) is driven to move the shutter 30A to the window 27A together with the lid 23 of the carrier CA in order to close the opening 22 by the lid 23 and close the window 27A by the shutter 30A. The carrier CA containing the twenty-five processed wafers W is removed from the carrier receiving-and-delivering section 2 by the not-shown external carrier conveyer. In this way, a series of process steps for the wafers W by using the processing system 1 are completed.

In removing the carrier CB from the carrier receiving-and-delivering part 2, the shutter 30B is moved to the window 27B together with the lid 23 of the carrier CB, in order to close the window 27B by the shutter 30B and close the opening 22 by the lid 23. The carrier CB containing the monitor wafers MW is removed from the carrier receiving-and-delivering section 2 by the not-shown external carrier conveyer. The monitor wafers MW contained in the carrier CB are transferred to a not-shown inspection apparatus, which inspects the surface condition of the monitor wafers MW, for example, whether or not a polymer removed from the wafers W adheres to the monitor wafers MW. Thus, It is possible to estimate how the wafers W affect one another in the substrate processing device 76, and also possible to estimate the conditions in the substrate processing device 76.

In the processing system 1, three of the twenty-five wafers W are automatically replaced with the monitor wafers MW. Since the replacement operation is carried out in the wafer transfer unit 3 which is maintained clean by the downflow air of the FFU 15, adhesion of particles to the wafers W and the monitor wafers MW can be prevented. The carrying arms 46 of the carrying arm set 45B and the carrying arms 46 of the carrying arm set 45A are used such that the former handle the processed wafers W and the processed monitor wafers MW while the latter handle the unprocessed wafers W and the unprocessed monitor wafers MW. Thus, adhesion of particles or the like to the processed wafers W and the processed monitor wafers MW from the carrying arm set 45A can be prevented. In the normal process which processes only the wafers W (i.e., product wafers) in a batch without concurrently processing any monitor wafers MW, since the plurality of wafers W can be transferred collectively between the carrier CA and the rotor 92, improved throughput can be achieved.

As the plural-wafer conveyer 40 transfers the wafers W and the monitor wafers MW collectively to the rotor 92, it is not necessary for the single-wafer conveyer 41 to move a position where the single-wafer conveyer 41 locates In front of the rotor 92, and it is not necessary for the plural-wafer conveyer 41 to withdraw in the Y-axis direction. Thus, there is no need for increasing the size of the wafer transfer unit 3 as compared with a conventional one, whereby space can be saved.

Although a preferred embodiment of the present invention has been described, the present invention is not limited thereto. For example, the substrate is not limited to a semiconductor wafer W, and may be a glass substrate for an LCD (liquid crystal display), a CD (compact disk) substrate, a substrate for a printed-circuit board, a ceramic substrate, and so on. The processing system may be such that it performs a process for substrates other than the aforementioned polymer removing process, by using various processing liquids.

In the aforementioned embodiment, the processing unit 5 is such that the wafers W held by the rotor 92 are processed in the dual chamber 142. The processing unit may be of another type which processes wafers in a batch. For example, the processing unit may be configured to sequentially immerse the wafers in plural processing baths each storing processing liquid.

In the aforementioned embodiment, twenty-five wafers W are contained in the carrier CA, and three of the twenty-five wafers W are replaced with the monitor wafers MW. However, the number of wafers W and the monitor wafers MW contained in the carriers CA and CB when being loaded to the processing system 1, and the number of wafers W to be replaced with the monitor wafers MW are not limited to the number described in the aforementioned embodiment. In the aforementioned embodiment, the uppermost, thirteenth, and lowermost wafers W are replaced with the monitor wafers MW. However, any three of wafers M may be replaced with the monitor wafers MW.

In the aforementioned embodiment, a procedure for replacing three of the twenty-five wafers W with the monitor wafer MW is described. However, the single-wafer conveyer 41 may carry out the following procedures. That is, if a jump slot (a slot 21 not holding the wafer W) exists in the carrier CA, or if the carrier CA does not hold wafers W regularly, the wafers W can be rearranged by the single-wafer conveyer 41. The plural-wafer conveyer 40 first removes the irregularly contained wafers W collectively from the carrier CA. Then, before the plural-wafer conveyer 40 delivers the wafers W to the rotor assembly 85, the single-wafer conveyer 41 removes a wafer W from one of the carrying arms 46 of the carrying arm set 45A of the plural-wafer conveyer 40, and delivers the removed wafer W to a carrying arm 46 not holding a wafer W. Thus, the irregularly arranged wafers W can be rearranged so that they are spaced at regular intervals, thereby equal processing conditions for each wafer W can be achieved. Furthermore, the single-wafer conveyer 41 may transfer a wafer W temporarily stored in the rack 42 to a carrying arm 46 of the carrying arm set 45A which does not holds a wafer W. In this way, the single-wafer conveyer 41 is capable of performing various transfer operations such as rearrangement and replenishment of the wafers W according to the number of wafers W or their arrangement condition in the carrier CA.

In the aforementioned embodiment, the carrier CA is placed on the carrier table 25A, and the twenty-five wafers W are removed correctively from the carrier CA. However, the processing system 1 may perform an operation in which the single-wafer conveyer 41 transfers a desired number of wafers W from the carrier CA placed on the carrier table 25B to the plural-wafer conveyer 40 one by one, and the plural-wafer conveyer 40 transfers the desired number of wafers W collectively to the rotor 92. Also, the plural-wafer conveyer 40 may remove the wafers W collectively, and the single-wafer conveyer 41 transfers the wafers W from the plural-wafer conveyer 40 to the carrier CA placed on the carrier table 25B.

The following description is made assuming that three wafers W are to be processed. A carrier CA containing three or more wafers W is placed on the carrier table 25B shown in FIG. 1 by the not shown external carrier conveyer. The single-wafer carrying arm 61 moves into the carrier CA, and removes one wafer W from the carrier CA. The carrying arms 46 of the carrying arm set 45A of the plural-wafer conveyer 40 turn to face the single-wafer conveyer 41. The wafer W held by the single-wafer carrying arm 61 is delivered to the carrying arm 46 of the carrying arm set 45A. Subsequently, the second and third wafers W are transferred from the carrier CA to the carrying arms 46 of the carrying arm set 45A one by one by the single-wafer carrying arm 61 in the same manner as mentioned above. In this way, the three wafers W are held by three of the carrying arms 46 of the carrying arm set 45A while the three wafers W are spaced at regular intervals. Thereafter, the carrying arm set 45A holding the three wafers W turns to face the window 81, delivers the three wafers W collectively to the rotor 92 of the rotor assembly 85. After the three wafers W are collectively processed by the substrate processing device 76, the three wafers W are collectively removed from the rotor 92 by the carrying arm set 45B. Then, the carrying arms 46 of the carrying arm set 45B holding the three wafers W turn to face the single-wafer conveyer 41. The single-wafer carrying arm 61 removes one of the three wafers W from the carrying arm 46 of the carrying arm set 45B, and delivers the removed wafer W to the carrier CA. The single-wafer carrying arm 61 transfers the remaining two wafers W held by the carrying arm set 45B to the carrier CA one by one, in the same way as mentioned above. As described above, in the processing system 1, wafers W can be loaded into and unloaded from the carrier CA one by one.

Figure 13:
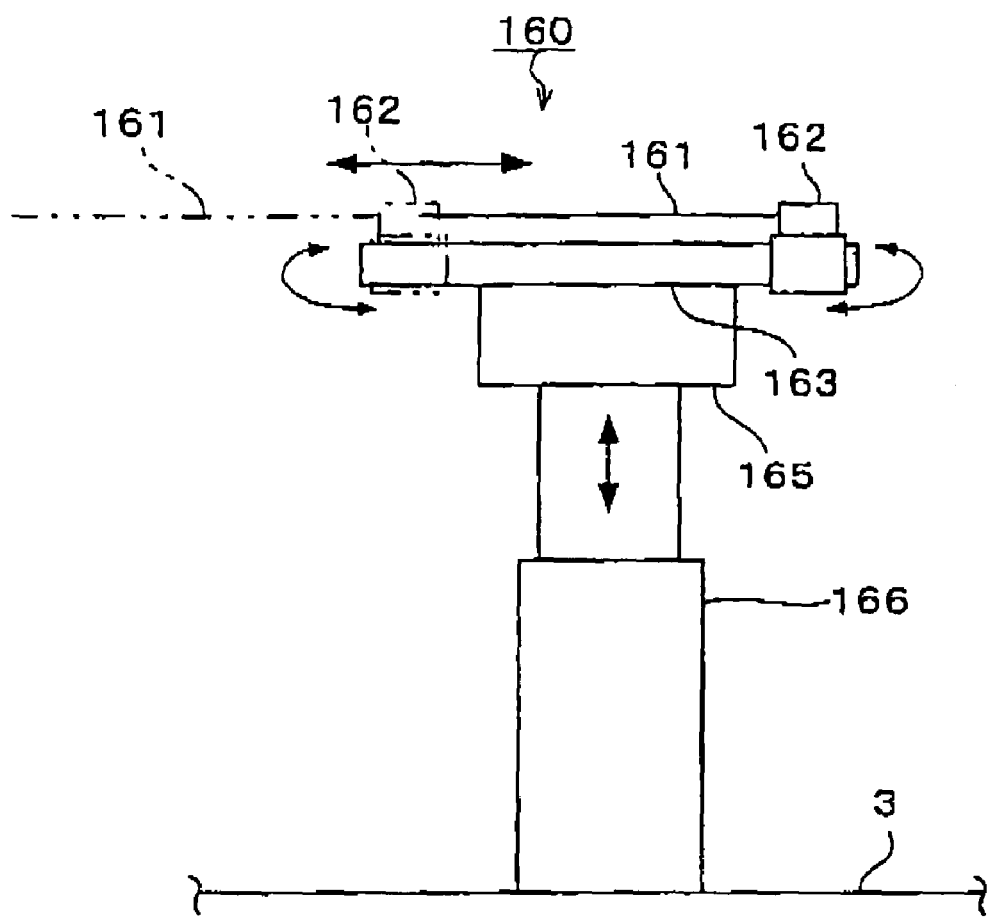
FIG. 13 is a side view of a single-wafer conveyer in another embodiment.

In the aforementioned embodiment, the single-wafer conveyer 41 is an articulated robot, but is not limited thereto. The single-wafer conveyer 41 may be of any type as long as it is capable of transferring the wafer and the monitor wafer MW among the carrier CB, the plural-wafer conveyer 40, and the rack 42. FIG. 13 shows an alternative embodiment of the single-wafer conveyer. The single-wafer conveyer 150 has one single-wafer carrying arm 161 held in a substantially horizontal posture. The single-wafer carrying arm 161 is held by a holding part 162, and is capable of holding one wafer W or one monitor wafer MW in substantially a horizontal posture. The holding part 162 is supported by a slide mechanism 163. The slide mechanism 163 is supported by a rotation mechanism 165. The rotation mechanism 165 is supported by an elevating mechanism 166. The elevating mechanism 166 is fixed to the bottom of the wafer transfer unit 3. When driving the elevating mechanism 166, the rotation mechanism 165 moves vertically together with the single-wafer carrying arm 161, the holding part 162, and the slide mechanism 163. When driving the rotation mechanism 165, the slide mechanism 163 rotates about a vertical rotation axis together with the single-wafer carrying arm 161 and the holding part 162. When driving the slide mechanism 163, the holding part 162 slides horizontally together with the single-wafer carrying arm 161. Also in this embodiment, the single-wafer carrying arm 161 is moved in horizontal and vertical planes by driving the slide mechanism 163, the rotation mechanism 165, and the elevating mechanism 166 so as to transfer the wafers W and the monitor wafers MW among the carrier CB, the plural-wafer conveyer 40, and the rack 42.

Figure 14:
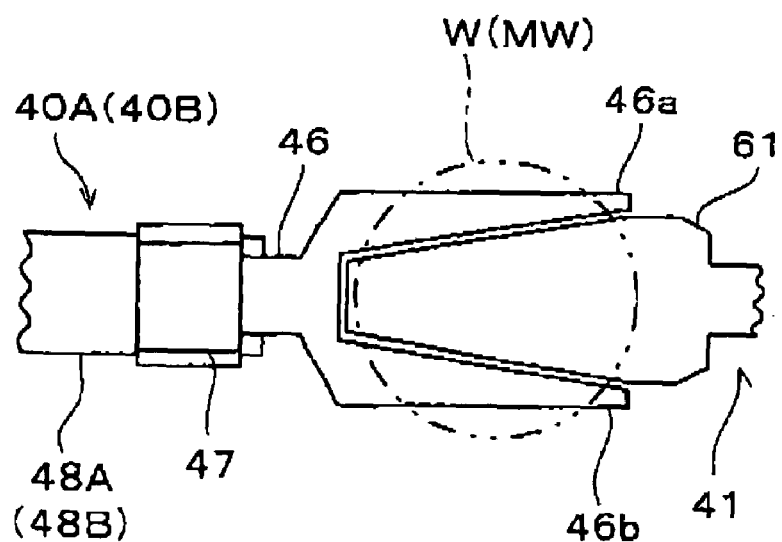
FIG. 14 is a top plan view of carrying arms of the plural- and single-wafer conveyers in another embodiment.

In the aforementioned embodiment, the single-wafer carrying arm 61 has a substantially U-shape, and each carrying arm 46 is configured so that it can pass through a space between the fingers 61a and 61b of the single-wafer carrying arm 61. The carrying arm 46 and the single-wafer carrying arm 61 may have any configuration as long as a wafer W (and a monitor wafer MW) can be transferred between them. For example, as shown in FIG. 14, each of the carrying arms 46 may have a U-shape, and the single-wafer carrying arm 61 may be configured so that it can pass through a space between two fingers 46a and 46b of the carrying arms 46.

In the aforementioned embodiment, the rack 42 is arranged beside the plural-wafer conveyer 40 and the single-wafer conveyer 41. However, the location of the rack 42 can be suitably changed. The wafer W, which has been removed from the carrying arm 46 of the carrying arm set 45A, may stand by at a suitable place other than the rack 42. For example, if the carrier CB has a slot 21 without holding any monitor wafer MW, the wafer W removed from the carrying arm set 45A may stand by in the slot 21.

What is claimed is:

1. A substrate processing system comprising:
   first and second carrier tables placed side by side and each adapted to hold thereon a substrate carrier;
   a substrate processing unit having a substrate holding device and adapted to collectively process, by using a processing liquid, a plurality of substrates while they are collectively held by the substrate holding device;
   a plural-substrate conveyer, disposed to face the first carrier table, adapted to hold a plurality of substrates collectively, adapted to collectively deliver and remove a plurality of substrates to and from a substrate carrier held on the first carrier table, and adapted to collectively deliver and remove a plurality of substrates to and from the substrate holding device of the substrate processing unit, the plural-substrate conveyer including a plurality of substrate holding members each adapted to hold a substrate;
   a single-substrate conveyer, disposed beside the plural-substrate conveyer to face the second carrier table, adapted to hold only one substrate at a time, adapted to deliver and remove a substrate to and from any one of a plurality of substrate holding slots of a substrate carrier held on the first carrier table, and adapted to deliver and remove a substrate to and from any one of the substrate holding members of the plural-substrate conveyer; and
   a partition wall having a window, disposed between an area where the plural-substrate conveyer and the single-substrate conveyer are disposed and an area where the substrate holding device is disposed so that the partition wall allows the plural-substrate conveyer to access the substrate holding device through the window but inhibits the single-substrate conveyer from accessing the substrate holding device, wherein the first carrier table, the plural-substrate conveyer, and the substrate holding device are aligned in a row in plan view.

2. The substrate processing system according to claim 1, further comprising a substrate storage adapted to hold at least one substrate, wherein the single-substrate conveyer is adapted to deliver and remove a substrate to and from the substrate storage.

3. The substrate processing system according to claim 1, further comprising a plurality-of carrier tables, arranged in a horizontal direction, each adapted to support a substrate carrier thereon, wherein:
   the substrate holding members of the plural-substrate conveyer are vertically spaced at predetermined intervals while each of substrate holding members is in a horizontal posture;
   the plural-substrate conveyer is provided with a horizontal moving mechanism adapted to move the substrate holding members in a direction parallel to the horizontal direction to allow the substrate holding members to access a substrate carrier supported by each of the carrier tables; and
   the single-substrate conveyer is adapted to access a substrate carrier supported by only one of the carrier tables.

4. The substrate processing system according to claim 1, further comprising:
   a plurality of carrier tables, arranged in a horizontal direction, each adapted to support a substrate carrier thereon; and
   a substrate storage adapted to hold at least one substrate, wherein:
   the substrate holding members of the plural-substrate conveyer are vertically spaced at predetermined intervals while each of the substrate holding members is in a horizontal posture;
   the plural-substrate conveyer is provided with a horizontal moving mechanism adapted to move the substrate holding members in a direction parallel to the horizontal direction to allow the substrate holding members to access a substrate carrier supported by each of the carrier tables;
   the single-substrate conveyer is adapted to deliver and remove a substrate to and from the substrate storage; and
   the single-substrate conveyer is adapted to access a substrate carrier supported by only one of the carrier tables.

5. The substrate processing system according to claim 1, wherein:
   each of the substrate holding members is arranged in a horizontal posture;
   the substrate holding members are vertically spaced at predetermined intervals; and
   the plural-substrate conveyer includes a slide mechanism adapted to horizontally slide the substrate holding members as a unit, a rotation mechanism adapted to rotate the substrate holding members as a unit about a vertical rotation axis, and an elevation mechanism adapted to vertically move the substrate holding members as a unit.

6. The substrate processing system according to claim 1, further comprising a sequence controller configured to control the plural-substrate conveyer and the single-substrate conveyer according to a predetermined sequence of operations including the steps of:
   (i) removing first sort of substrates collectively from a first substrate carrier by the plural-substrate conveyer;
   (ii) removing one of the first sort of substrates from one of the substrate holding members of the plural-substrate conveyer by the single-substrate conveyer;
   (iii) delivering said one of the first sort of substrates to the substrate storage by the single-substrate conveyer;
   (iv) removing a second sort of substrate from a second substrate carrier by the single-substrate conveyer;
   (v) delivering the second sort of substrate to said one of the substrate holding members by the single-substrate conveyer;
   (vi) repeating the steps (ii) to (v), if necessary; and
   (vii) delivering the substrates held by the plural-substrate conveyer collectively to the substrate holding device of the substrate processing unit by the plural-substrate conveyer.

7. A substrate processing method comprising the steps of:
   providing a substrate processing apparatus including:
      first and second carrier tables placed side by side and each adapted to hold thereon a substrate carrier;
      a substrate processing unit having a substrate holding device and adapted to collectively process, by using a processing liquid, a plurality of substrates while they are collectively held by the substrate holding device;

a plural-substrate conveyer, disposed to face the first carrier table, adapted to hold a plurality of substrates collectively, adapted to collectively deliver and remove a plurality of substrates to and from a substrate carrier held on the first carrier table, and adapted to collectively deliver and remove a plurality of substrates to and from the substrate holding device of the substrate processing unit, the plural-substrate conveyer including a plurality of substrate holding members each adapted to hold a substrate;

a single-substrate conveyer, disposed beside the plural-substrate conveyer to face the second carrier table, adapted to hold only one substrate at a time, adapted to deliver and remove a substrate to and from any one of a plurality of substrate holding slots of a substrate carrier held on the first carrier table, and adapted to deliver and remove a substrate to and from any one of the substrate holding members of the plural-substrate conveyer; and a partition wall having a window, disposed between an area where the plural-substrate conveyer and the single-substrate conveyer are disposed and an area where the substrate holding device is disposed so that the partition wall allows the plural-substrate conveyer to access the substrate holding device through the window but inhibits the single-substrate conveyer from accessing the substrate holding device, wherein the first carrier table, the plural-substrate conveyer and the substrate holding device are aligned in a row in plan view;

collectively removing a plurality of product substrates from a substrate carrier held on the first carrier table by the plural-substrate conveyer;

removing one of the product substrates from one of the substrate holding members of the plural-substrate conveyer by the single-substrate conveyer;

removing a monitor substrate from a substrate carrier by the single-substrate conveyer;

transferring the monitor substrate from the single-substrate conveyer to said one of the substrate holding members of the plural-substrate conveyer;

collectively delivering the monitor substrate and the product substrates other than said one of the product substrates into the substrate processing unit by the plural-substrate conveyer;

collectively processing the monitor substrate and the product substrates other than said one of the product substrates by the substrate processing unit;

collectively removing the monitor substrate and the product substrates other than said one of the product substrates from the substrate processing unit by the plural-substrate conveyer;

removing the monitor substrate from the plural-substrate conveyer by the single-substrate conveyer;

delivering the monitor substrate to a substrate carrier held on the second carrier table by the single-substrate conveyer; and collectively delivering the product substrates held by the plural-substrate conveyer to a substrate carrier held on the first carrier table by the plural-substrate conveyer.

8. A substrate processing method comprising the steps of:

providing a substrate processing apparatus including:

first and second carrier tables placed side by side and each adapted to hold thereon a substrate carrier;

a substrate processing unit having a substrate holding device and adapted to collectively process, by using a processing liquid, a plurality of substrates while they are collectively held by the substrate holding device;

a plural-substrate conveyer, disposed to face the first carrier table, adapted to hold a plurality of substrates collectively, adapted to collectively deliver and remove a plurality of substrates to and from a substrate carrier held on the first carrier table, and adapted to collectively deliver and remove a plurality of substrates to and from the substrate holding device of the substrate processing unit, the plural-substrate conveyer including a plurality of substrate holding members each adapted to hold a substrate;

a single-substrate conveyer, disposed beside the plural-substrate conveyer to face the second carrier table, adapted to hold only one substrate at a time, adapted to deliver and remove a substrate to and from any one of a plurality of substrate holding slots of a substrate carrier held on the first carrier table, and adapted to deliver and remove a substrate to and from any one of the substrate holding members of the plural-substrate conveyer; and a partition wall having a window, disposed between an area where the plural-substrate conveyer and the single-substrate conveyer are disposed and an area where the substrate holding device is disposed so that the partition wall allows the plural-substrate conveyer to access the substrate holding device through the window but inhibits the single-substrate conveyer from accessing the substrate holding device, wherein the first carrier table, the plural-substrate conveyer and the substrate holding device are aligned in a row in plan view;

collectively removing a plurality of product substrates from a substrate carrier held on the first carrier table by a first group of substrate holding members of the plural-substrate conveyer;

removing one of the product substrates from one of the substrate holding members of the first plural-substrate conveyer, and delivering it to substrate storage, by the single-substrate conveyer;

removing a monitor substrate from a substrate carrier held on the second carrier table, and delivering it to said one of the first group of substrate holding members of the plural-substrate conveyer, by the single-substrate conveyer;

collectively delivering the monitor substrate and the product substrates other than said one of the product substrates into the substrate processing unit by the first plural-substrate conveyer;

collectively processing the monitor substrate and the product substrates other than said one of the product substrates in the substrate processing unit;

collectively removing the monitor substrate and the product substrates other than said one of the product substrates from the substrate processing unit by a second group of substrate holding members of the plural-substrate conveyer;

removing the monitor substrate from one of the second group of substrate holding members of the plural-substrate conveyer, and delivering it to a substrate carrier held on the second carrier table, by the single-substrate conveyer;

removing said one of the product substrates from the substrate storage, and delivering it to one of the first group of substrate holding members of the plural-substrate conveyer;

delivering said one of the product substrates to the substrate processing unit by said one of the first group of substrate holding members of the plural-substrate conveyer;

processing said one of the product substrates by the substrate processing unit;

removing said one of the product substrates by one of the first group of substrate holding members of the plural-substrate conveyer;

removing said one of the product substrates from said one of the first group of substrate holding members of the plural-substrate conveyer, and delivering it to said one of the second group of substrate holding members of the plural-substrate conveyer, by the single-substrate conveyer; and collectively delivering the product substrates, which are held by the second group of substrate holding members of the plural-substrate conveyer, to a substrate carrier held on the first carrier table.

9. A substrate processing system comprising the steps of:

providing a substrate processing apparatus including:

first and second carrier tables placed side by side and each adapted to hold thereon a substrate carrier;

a substrate processing unit having a substrate holding device and adapted to collectively process, by using a processing liquid, a plurality of substrates while they are collectively held by the substrate holding device;

a plural-substrate conveyer, disposed to face the first carrier table, adapted to hold a plurality of substrates collectively, adapted to collectively deliver and remove a plurality of substrates to and from a substrate carrier held on the first carrier table, and adapted to collectively deliver and remove a plurality of substrates to and from the substrate holding device of the substrate processing unit, the plural-substrate conveyer including a plurality of substrate holding members each adapted to hold a substrate;

a single-substrate conveyer, disposed beside the plural-substrate conveyer to face the second carrier table, adapted to hold only one substrate at a time, adapted to deliver and remove a substrate to and from any one of a plurality of substrate holding slots of a substrate carrier held on the first carrier table, and adapted to deliver and remove a substrate to and from any one of the substrate holding members of the plural-substrate conveyer; and a partition wall having a window, disposed between an area where the plural-substrate conveyer and the single-substrate conveyer are disposed and an area where the substrate holding device is disposed so that the partition wall allows the plural-substrate conveyer to access the substrate holding device through the window but inhibits the single-substrate conveyer from accessing the substrate holding device, wherein the first carrier table, the plural-substrate conveyer and the substrate holding device are aligned in a row in plan view;

removing a substrate from a substrate carrier held on the second carrier table by the single-substrate conveyer;

transferring the substrate from a single-substrate conveyer to one of substrate holding members of the plural-substrate conveyer;

delivering the substrate to the substrate processing unit by the plural-substrate conveyer;

processing the substrate by the substrate processing unit;

removing the substrate from the substrate processing unit by the plural-substrate conveyer;

removing the substrate from the plural-substrate conveyer unit by the single-substrate conveyer; and delivering the substrate to a substrate carrier held on the second carrier table by the single-substrate conveyer.

* * * * *